US008299349B2

(12) United States Patent
Rhyee et al.

(10) Patent No.: US 8,299,349 B2
(45) Date of Patent: Oct. 30, 2012

(54) THERMOELECTRIC MATERIALS AND CHALCOGENIDE COMPOUNDS

(75) Inventors: Jong-soo Rhyee, Suwon-si (KR); Sang-mock Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 539 days.

(21) Appl. No.: 12/505,841

(22) Filed: Jul. 20, 2009

(65) Prior Publication Data

US 2010/0051080 A1    Mar. 4, 2010

Related U.S. Application Data

(60) Provisional application No. 61/178,211, filed on May 14, 2009.

(30) Foreign Application Priority Data

Jul. 18, 2008 (KR) .................. 10-2008-0070167
Jan. 7, 2009 (KR) .................. 10-2009-0001251

(51) Int. Cl.
  *H01L 35/16* (2006.01)
  *H01L 29/12* (2006.01)
(52) U.S. Cl. ........ 136/238; 136/200; 136/201; 136/239; 136/236.1; 252/62.3 T
(58) Field of Classification Search .................. 136/239, 136/238, 200, 201, 236.1; 252/62.3 T
See application file for complete search history.

(56) References Cited

U.S. PATENT DOCUMENTS

| 3,208,022 | A | * | 9/1965 | Sihvonen et al. ............ 252/625 |
| 4,589,918 | A |   | 5/1986 | Nishida et al. |
| 5,875,098 | A | * | 2/1999 | Leavitt et al. ............... 361/708 |
| 6,169,245 | B1 |   | 1/2001 | Sharp |
| 2002/0062854 | A1 | | 5/2002 | Sharp |
| 2003/0056819 | A1 | | 3/2003 | Imai et al. |
| 2006/0255310 | A1 | | 11/2006 | Funahashi |
| 2007/0056624 | A1 | * | 3/2007 | Gregory et al. ............ 136/238 |

FOREIGN PATENT DOCUMENTS

| JP | 10-227020 A | 8/1998 |
| JP | 11-186616 A | 7/1999 |
| JP | 11186616 A | 7/1999 |

(Continued)

OTHER PUBLICATIONS

Dongol, "Characterization of In4Te3 Single Crystals", Dec. 2003, Turk. J. Phys, vol. 27,pp. 211-218.*

(Continued)

*Primary Examiner* — Jonathan Johnson
*Assistant Examiner* — Devina Pillay
(74) *Attorney, Agent, or Firm* — Cantor Colburn LLP

(57) ABSTRACT

A thermoelectric material is disclosed. The thermoelectric material is represented by the following formula; $(A_{1-a}A'_a)_{4-x}(B_{1-b}B'_b)_{3-y}$. A is a Group XIII element and A' may be a Group XIII element, a Group XIV element, a rare earth element, a transition metal, or combinations thereof. A and A' are different from each other. B may be S, Se, Te and B' may be a Groups XIV, XV, XVI or combinations thereof. B and B' are different from each other. a is equal to or larger than 0 and less than 1. b is equal to or larger than 0 and less than 1. x is between −1 and 1 and wherein y is between −1 and 1.

48 Claims, 19 Drawing Sheets

FOREIGN PATENT DOCUMENTS

| | | |
|---|---|---|
| JP | 2001-085751 A | 3/2001 |
| JP | 2001085751 A | 3/2001 |
| JP | 2002-033526 A | 1/2002 |
| JP | 2002033526 A | 1/2002 |
| JP | 2002-270907 A | 9/2002 |
| JP | 2002270907 A | 9/2002 |
| JP | 2004-040068 A | 2/2004 |
| JP | 2004040068 A | 2/2004 |
| JP | 2005-005675 A | 1/2005 |
| JP | 2006-037149 A | 2/2006 |
| JP | 2006-310361 A | 11/2006 |
| JP | 2006310361 A | 11/2006 |
| KR | 10-0310478 B1 | 11/2001 |
| KR | 10-0581049 B1 | 5/2006 |
| KR | 10-0621443 B1 | 9/2006 |
| KR | 10-0749122 B1 | 8/2007 |
| WO | 9828801 A1 | 7/1998 |

OTHER PUBLICATIONS

Moshkova, "Influence of Doping on Optical and Photoelectric Properties of In4(Se3)1-xTe3x single crystals", Dec. 2005, Ukr. J. Phys., vol. 50 N. 12, pp. 1356-1360.*

Seo, "Thermoelectric properties of sintered polycrystalline ZnIn2S4" Nov. 1999, J. Mater Res. vol. 14 No. 11, pp. 4176-4181.*

DiSalvo, "Thermoelectric Cooling and Power Generation", Jul. 1999, Science, vol. 285, pp. 703-706.*

Losovyj, et al., The Electronic Structure of Surface Chains in the Layered Semiconductor In4Se3(100), Applied Physics Letters 92, pp. 122107-1-122107-3 (2008).

International Search Report issued by Korean Intellectual Property Office on Feb. 23, 2010; PCT/KR2009/003975.

Comments of the Examiner-Chinese Patent Application No: 200980128068.5.

M. Sznajder et al., "Similarities of the band structure of In4Se3 and InSe under pressure and peculiarities of the creation of the band gap", phys. stat. sol., vol. 243, No. 3, 2006, pp. 592-609.

M. Dongol et al., "Characterization of In4Te3 Single Crystals", Turk J. Phys, vol. 27, 2003, pp. 211-218.

Office Action issued by Chinese Patent Office on Mar. 9, 2012.

* cited by examiner

THERMOELECTRIC MATERIALS AND CHALCOGENIDE COMPOUNDS

CROSS-REFERENCE TO RELATED APPLICATIONS

This application claims priority to Korean Patent Application No. 10-2008-0070167, filed on Jul. 18, 2008 and Korean Patent Application No. 10-2009-0001251, filed on Jan. 7, 2009, and U.S. Provisional Patent Application No. 61/178,211, filed on May 14, 2009, and all the benefits accruing therefrom under 35 U.S.C. §119, the contents of which in their entirety are herein incorporated by reference.

BACKGROUND

1. Field

One or more exemplary embodiments relate to a thermoelectric material and a chalcogenide compound, and more particularly, to a thermoelectric material and a chalcogenide compound both having low thermal conductivity and a high Seebeck coefficient.

2. Description of the Related Art

In general, thermoelectric materials are used in active cooling, waste heat power generation, and other similar applications of the Peltier effect and the Seebeck effect. FIG. 1 is a schematic diagram illustrating thermoelectric cooling using the Peltier effect. Referring to FIG. 1, the Peltier effect is a phenomenon whereby, when a DC voltage is externally applied, holes of a p-type material and electrons of an n-type material are transported to cause heat absorption at one side of both the p-type and n-type materials. FIG. 2 is a schematic diagram illustrating thermoelectric power generation using the Seebeck effect. Referring to FIG. 2, the Seebeck effect is a phenomenon whereby, when heat is supplied from an external heat source, current-flow is generated in the material while electrons and holes are transported to cause power generation.

Active cooling that uses such a thermoelectric material improves thermal stability of devices, does not cause vibration and noise, and does not use a separate condenser and refrigerant, and the active cooling method is environmentally-friendly. Thus, active cooling that uses such a thermoelectric material may be applied to refrigerant-free refrigerators, air conditioners, a variety of micro cooling systems, and the like. In particular, when a thermoelectric device is attached to memory devices or other computer devices, the temperature of the devices may be maintained to be uniform and stable, especially in comparison with a conventional cooling method. Thus, the memory device or other computer device can have improved performance.

Meanwhile, when thermoelectric materials are used in thermoelectric power generation using the Seebeck effect, the waste heat is extracted and transformed to electrical energy by the thermoelectric materials. Thus, thermoelectric materials may be applied in a variety of fields that increase energy efficiency or reuse waste heat, such as in vehicle engines and air exhausters, waste incinerators, waste heat in iron mills, power sources of medical devices in the human body using human body heat, and other applications.

A dimensionless figure-of-merit ZT, defined as shown in Equation 1 below, is used to show the performance efficiency of a thermoelectric material.

$$ZT = \frac{S^2 \sigma T}{k} \qquad \text{Mathematical Formula 1}$$

Here, S is a Seebeck coefficient, σ is an electrical conductivity, T is an absolute temperature, and κ is a thermal conductivity of a thermoelectric material.

To increase values of the dimensionless figure-of-merit ZT, there is a need to develop a material having a high Seebeck coefficient and high electrical conductivity and low thermal conductivity.

SUMMARY

One or more exemplary embodiments include a thermoelectric material having low thermal conductivity and a high Seebeck coefficient.

One or more exemplary embodiments include a chalcogenide compound having low thermal conductivity and a high Seebeck coefficient.

One or more exemplary embodiments include a single crystalline or polycrystalline thermoelectric material having lower thermal conductivity and a high Seebeck coefficient.

Additional aspects will be set forth in part in the description which follows and, in part, will be apparent from the description, or may be learned by practice of the invention.

One or more exemplary embodiments may include a thermoelectric material comprising a chalcogen compound represented by the following formula;

$(A_{1-a}A'_a)_{4-x}(B_{1-b}B'_b)_{3-y}$ wherein A is a Group XIII element, and A' is at least one selected from a group consisting of a Group XIII element, a Group XIV element, a rare earth element, a transition metal, and combinations thereof wherein A and A' are different from each other, and wherein B is at least one selected from a group consisting of S, Se, Te and combinations thereof, and B' is at least one selected from a group consisting of elements of Groups XIV, XV, XVI and combinations thereof, wherein B and B' are different from each other, wherein a is equal to or larger than 0 and less than 1, wherein b is equal to or larger than 0 and less than 1, wherein x is between −1 and 1, and wherein y is between −1 and 1.

In one exemplary embodiment of a thermoelectric material, x may be greater than 0 and less than 1.

In one exemplary embodiment of a thermoelectric material, y may be greater than 0 and less than 1.

In one exemplary embodiment of a thermoelectric material, A may be at least one of In and Ga. In one exemplary embodiment of a thermoelectric material, the transition metal may be at least one selected from a group consisting of Y, Fe, Mn, Co, Ni, Cu, Zn, Zr, Nb, Hf, Ta, and combinations thereof.

In one exemplary embodiment of a thermoelectric material, B may at least one of Se and Te.

In one exemplary embodiment of a thermoelectric material, the thermoelectric material may have a thermal conductivity equal to or less than about 2 W/mK at room temperature.

In one exemplary embodiment of a thermoelectric material, the thermoelectric material may an absolute Seebeck coefficient of more than 220 μV/K at high temperature, e.g., 450K.

In one exemplary embodiment of a thermoelectric material, the thermoelectric material may have a density of about 70% to about 100% of its theoretical density.

In one exemplary embodiment of a thermoelectric material, a covalent bond may be formed in an in-plane direction, and at least one of an ionic bond and a Van der Waals bond may be formed between layers.

In one exemplary embodiment of a thermoelectric material, the thermoelectric material may have low-dimensional conductivity.

In one exemplary embodiment of a thermoelectric material, the thermoelectric material may have one of a single crystalline structure and a polycrystalline structure.

In one exemplary embodiment of a thermoelectric material, the thermoelectric material may have a single crystalline structure and may be cut in a direction substantially perpendicular to a growth direction.

To achieve the above and/or other aspects, one or more embodiments may include a chalcogenide compound having lattice distortion and represented by Chemical Formula 1 above.

BRIEF DESCRIPTION OF THE DRAWINGS

These and/or other aspects, advantages, and features will become more readily apparent and more readily appreciated from the following description of the exemplary embodiments, taken in conjunction with the accompanying drawings, of which.

DETAILED DESCRIPTION

Figure 1:
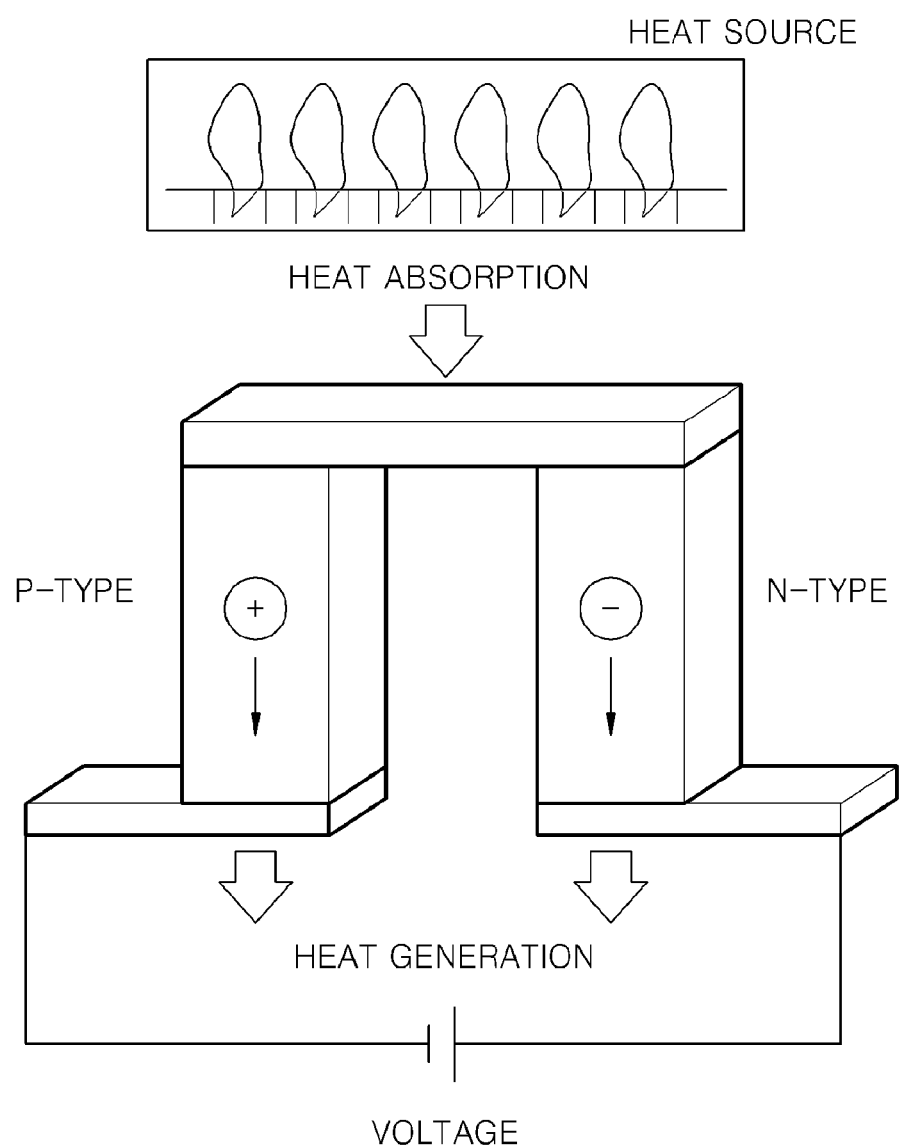
FIG. 1 is a schematic diagram illustrating thermoelectric cooling using the Peltier effect.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

An exemplary embodiment of a compound efficiently used as a thermoelectric material is represented by Chemical Formula 1 below:

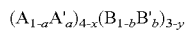   <Chemical Formula 1> wherein A is a Group XIII element, and A' is at least one selected from a group consisting of a Group XIII element, a Group XIV element, a rare earth element, a transition metal and combinations thereof, wherein A and A' are different from each other, B is at least one selected from a group consisting of S, Se, and Te, and B' is at least one selected from a group consisting of elements of Groups XIV, XV, XVI and combinations thereof, wherein B and B' are different from each other, and wherein the following inequalities apply: $0 \leq a < 1$, $0 \leq b < 1$, $-1 < x < 1$, and $-1 < y < 1$.

The exemplary embodiment of a compound represented by Chemical Formula 1 may have a two-dimensional layered structure, have orientation in a preferred direction, and have low thermal conductivity due to a Van der Waals bond formed between the layers.

In particular, an exemplary embodiment of the compound of Chemical Formula 1 may have a structure without lattice distortion. However, alternative exemplary embodiments include configurations wherein the compound of Chemical Formula 1 may also have lattice distortion due to current density changes. In particular, with an increase in a current density, a strong interaction between electrons and quantized lattice vibrations may distort lattices of the compound, thereby decreasing thermal conductivity. For example, in an exemplary embodiment where the current density is in a range of about $10^{16}/cm^3$ to about $10^{20}/cm^3$, or $10^{16}/cm^3$ to about $10^{18}/cm^3$, or $10^{17}/cm^3$ to about $10^{19}/cm^3$, the lattice distortion may occur. The current density may be measured by a well-known Hall resistance measurement method.

Exemplary embodiments also include configurations wherein the lattice distortion is induced by changing physical properties of the compound of Chemical Formula 1 by changing conditions for the preparation of the compound, adding a doping element, or inducing defects, in order to change the current density.

Exemplary embodiments include configurations wherein the physical properties of the compound may be changed by controlling an annealing temperature, annealing time, or pressure of the compound during manufacturing. The defects may be induced by insufficiently adding, e.g., adding a reduced amount of, A and/or B, which are raw materials for the preparation of the compound of Chemical Formula 1.

The compound of Chemical Formula 1 may have lattice distortion in an in-plane direction, an orientation in an out-of-plane direction, and low thermal conductivity due to a change of the current density as described above.

Since the component A of the compound is quasi-one-dimensionally arranged in a lattice structure and electrons or holes are transported well through the lattice structure due to the one-dimensional arrangement, a Seebeck coefficient of the compound of Chemical Formula 1 is increased due to low-dimensional conductivity.

In the compound of Chemical Formula 1, electrical conductivity is improved by selectively adding a doping component of A' or B' to base components of A and B, respectively, and thus the dimensionless quantity ZT of Mathematical Formula 1 below is increased.

$$ZT = \frac{S^2 \sigma T}{k} \qquad \text{\langle Mathematical Formula 1\rangle}$$

Here, S is a Seebeck coefficient, σ is electrical conductivity, T is absolute temperature, and κ is thermal conductivity.

In Chemical Formula 1 above, A and B are base components that form a layered structure in the compound of Chemical Formula 1. Exemplary embodiments include configurations wherein A may be a Group XIII element, and B may be at least one selected from a group consisting of S, Se, and Te.

In one exemplary embodiment, the Group XIII element may be Ga and/or In. In one exemplary embodiment, A', which is doped on A as a substituent, may be at least one selected from a group consisting of a Group XIII element, a Group XIV element, a rare earth element, and a transition metal, wherein A and A' are different from each other. Exemplary embodiments of the transition metal may be Y, Fe, Mn, Co, Ni, Cu, Zn, Zr, Nb, Hf, or Ta. Exemplary embodiments include configurations wherein the rare earth element may be a lanthanide element.

The doping component A' is selectively added to the base components to optimize current density of the compound. As a molar ratio of A', $0 \leq a < 1$, for example, in one exemplary embodiment $0 \leq a < 0.5$. If the molar ratio of A' is not within the range described above, A' may not be doped on A but exist as an impurity, thereby hurting the low-dimensional conductivity.

In Chemical Formula 1 above, component B, which acts as the base component, may be at least one selected from a group consisting of S, Se, and Te. Exemplary embodiments of the molar ratio of A to B may be about 4:3−y, wherein −1<y<1, for example, in one exemplary embodiment 0<y<1.

Exemplary embodiments also include configurations wherein x and y are non-zero.

The substituent B' that is doped on B may be different from B.

The substituent B' may be selectively added to the base components to optimize current density of the thermoelectric material. As a molar ratio of B', $0 \leq b < 1$, for example, in one exemplary embodiment $0 \leq b < 0.5$. If the molar ratio of B' is not within the range described above, the crystal structure of the thermoelectric material may be changed, thereby hurting the low-dimensional conductivity.

The doping components A' and B' may be added in the form of one component, two components, three components or more components; in one exemplary embodiment A' may be up to three individual materials, e.g., a compound or mixture including a Group XIV element, a rare earth element and a transition metal. In the exemplary embodiment wherein the doping components A' and B' are added in the form of two components, a molar ratio thereof may be in the range of about 1:9 to about 9:1. In the exemplary embodiment wherein the doping components A' and B' are added in the form of three components, a molar ratio thereof may be in the range of about 1:0.1-0.9:0.1-0.9. However, the molar ratio is not limited thereto.

Each of the components forming the compound of Chemical Formula 1 may be bonded to each other to form the layered structure. In the layered structure, a covalent bond is formed in an in-plane direction, and an ionic bond and/or a Van der Waals bond is formed between layers.

Thermal conductivity $k_{tot}$ may be divided into thermal conductivity due to electrons $k_{el}$ and thermal conductivity due to vibration of the lattice $k_{ph}$, e.g., $k_{tot}=k_{el}+k_{ph}$. The electron thermal conductivity $k_{el}$ is proportional to electrical conductivity $\sigma$ and temperature T according to the Wiedemann-Frantz's law as shown in Mathematical Formula 2 below. Thus, the electron thermal conductivity $k_{el}$ is a dependent variable of the electrical conductivity. Accordingly, a high quality thermoelectric material may have low lattice thermal conductivity ($k_{ph}$), which may be obtained by controlling the lattice structure.

$$K_{el} = LT\sigma \text{ (wherein } L = 2.44 \times 10^{-8} \text{ } \Omega W/K^2\text{)} \quad \langle\text{Mathematical Formula 2}\rangle$$

The amount of B present in the compound of Chemical Formula 1 when x=0 and 0<y<1 is less than that when x=0 and y=0. In that case, the current density is increased so that interaction between the electrons and lattice vibrations distorts the lattice, thereby decreasing thermal conductivity.

In one exemplary embodiment, the thermoelectric material may include configurations wherein at least one of a and b is greater than 0 or wherein at least one of x and y is not equal to 0. Exemplary embodiments also include configurations wherein x is equal to 0. Exemplary embodiments also include configurations wherein an absolute Seebeck coefficient of the thermoelectric material is equal to or greater than about 220 W/mK at room temperature or wherein the Seebeck coefficient thereof is equal to or greater than about 220 W/mK at high temperature, e.g., about 450 K.

Figure 3A:
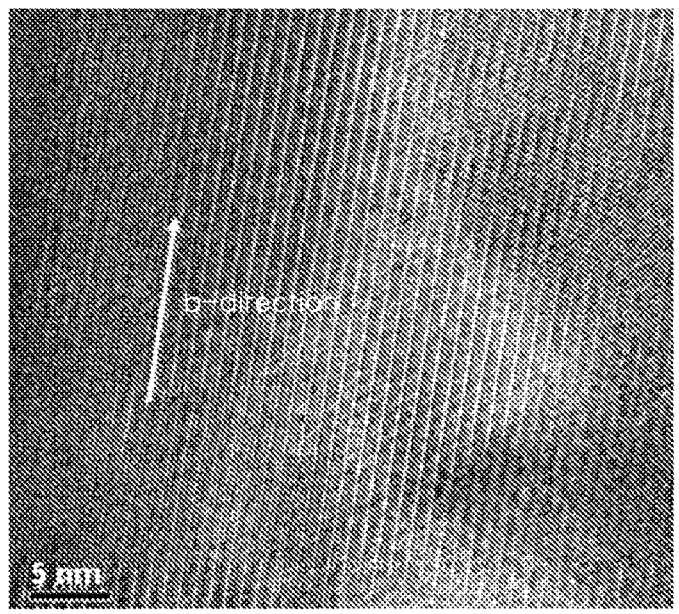
FIG. 3A is a transmission electron microscope ("TEM") image of an exemplary embodiment of a thermoelectric material $In_4Se_{3-\delta}$ (wherein $\delta=0.22$)
Figure 3B:
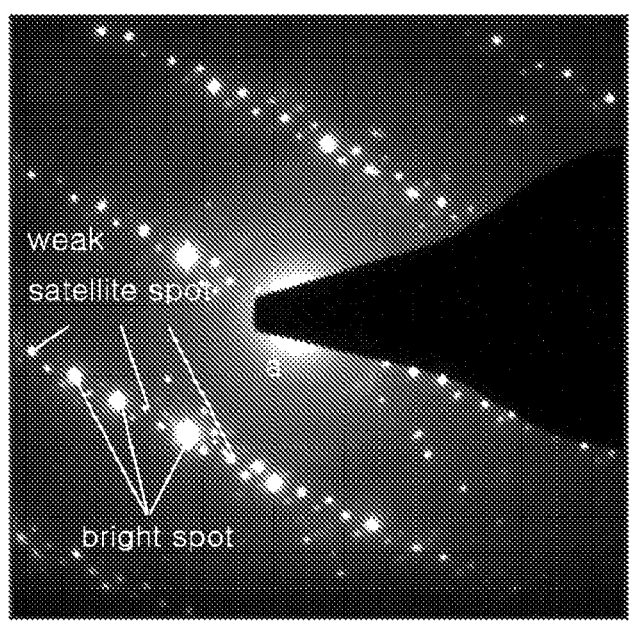
FIG. 3B is an electron diffraction pattern of an exemplary embodiment of a thermoelectric material $In_4Se_{3-\delta}$ (wherein $\delta=0.22$)

FIG. 3A is a transmission electron microscope ("TEM") image of $In_4Se_{3-\delta}$ (wherein $\delta$=0.22), as a compound of Chemical Formula 1, and FIG. 3B is an electron diffraction pattern of $In_4Se_{3-\delta}$ (wherein $\delta$=0.22). In FIG. 3A, the quasi-one-dimensional metallic chain is observed along the b-direction. In FIG. 3B, weak satellite spots observed between bright spots in the b-direction indicate lattice distortion existing in the b-direction. Due to this lattice distortion and the quasi-one-dimensional arrangement of one component, the compound of Chemical Formula 1 has a high ZT.

In one exemplary embodiment, in the structure of the compound of Chemical Formula 1, each of the layers forms rigid bonds, e.g. covalent bonds, in the presence of the lattice distortion in the in-plane direction, and the layers form week bonds, e.g., ionic bonds or Van der Waals bonds, as interlayer bonds, in the out-of-plain direction. Since transfer of phonons is less prevalent in the out-of-plain direction, and lattice distortion occurs in the in-plane direction, thermal conductivity is reduced both in the in-plane and out-of-plane directions. For example, in one exemplary embodiment the thermal conductivity of the compound of Chemical Formula 1 may be less than about 2 W/mK at room temperature.

The compound of Chemical Formula 1 has low-dimensional conductivity. The low-dimensional conductivity may be observed when an element is regularly arranged, and thus electrons are one-dimensionally or two-dimensionally conducted. A thermoelectric material having the low-dimensional conductivity may have an increased Seebeck coefficient.

The compound of Chemical Formula 1 may have a quasi-one-dimensional arrangement of A in order to ensure it has low-dimensional electrical conductivity, e.g., In, which is arranged in a row in one direction. Thus, electrons may be one-dimensionally or two-dimensionally conducted.

The density of energy states is increased at a fermi level in materials having low-dimensional conductivity. If the density of energy states has a sharp peak, the Seebeck coefficient is increased according to Mathematical Formula 3 below.

$$S \sim \left.\frac{d^2 \ln \varepsilon}{dk^2}\right|_{E=E_F} \quad \langle\text{Mathematical Formula 3}\rangle$$

In Mathematical Formula 3, S is a Seebeck coefficient, $\varepsilon$ is energy, and $E_F$ is fermi energy.

Since the compound of Chemical Formula 1 has low-dimensional conductivity in the lattice structure, the density of energy states is increased at a fermi level and the Seebeck coefficient is increased.

Thus, an exemplary embodiment of the compound of Chemical Formula 1 has low thermal conductivity and a high Seebeck coefficient due to the low-dimensional conductivity of electrons, thereby satisfying the requirements for a thermoelectric material.

The compound of Chemical Formula 1 may include the lattice distortion and a single crystalline or a polycrystalline structure. If the compound of Chemical Formula 1 is used as a thermoelectric material, the single crystalline or polycrystalline structure may influence its thermoelectric properties.

In addition, since exemplary embodiments include configurations wherein the compound of Chemical Formula 1 is cut in a particular shape when used as the thermoelectric element, properties of the compound of Chemical Formula 1 may vary according to the cutoff direction. For example, in an exemplary embodiment wherein the compound of Chemical Formula 1 has a single crystalline structure, the cutoff direction of the compound may be a direction substantially perpendicular to the growth direction during the fabrication of a thermoelectric element.

Exemplary embodiments of a method of synthesizing the compound of Chemical Formula 1 may be classified into polycrystalline synthesis and single crystal growth.

1. Polycrystalline Synthesis (1) One exemplary embodiment of a polycrystalline synthesis includes a method using an ampoule. An exemplary embodiment of such a method includes adding a material element to an ampoule made of a quartz tube or metal, sealing the ampoule in a vacuum, and heat treating the ampoule.

(2) Another exemplary embodiment of a polycrystalline synthesis includes an arc melting method. An exemplary embodiment of such a method includes adding a material element to a chamber, discharging an arc in an inert gas atmosphere to dissolve the material element, and preparing a sample.

(3) Another exemplary embodiment of a polycrystalline synthesis includes a solid state reaction method. An exemplary embodiment of such a method includes mixing a powder to process the power solidly and then heat treating the resultant, or heat treating a mixed powder and then processing and sintering the resultant.

2. Single Crystal Growth (1) Another exemplary embodiment of a single crystal growth synthesis includes a metal flux method. An exemplary embodiment of such a method includes adding a material element and an element that provides a gas atmosphere to a furnace so that the material element can grow satisfactorily into a crystal at a high temperature, and heat treating the resultant at a high temperature to grow a crystal.

(2) Another exemplary embodiment of a single crystal growth synthesis includes a Bridgeman method. An exemplary embodiment of such a method includes adding a material element to a furnace, heating the material element at an end portion of the furnace at a high temperature until the material element is dissolved, locally dissolving the material element while a region to be heated is slowly moved so as to pass the whole material element through the heated regions, and as a result, growing a crystal.

(3) Another exemplary embodiment of a single crystal growth synthesis includes an optical floating zone method. An exemplary embodiment of such a method includes preparing a material element in the form of a seed rod and a feed rod, converging light of a lamp on the feed rod to locally dissolve the material element at a high temperature, and then slowly moving a region to be irradiated to dissolve the material element to grow a crystal.

(4) Another exemplary embodiment of a single crystal growth synthesis includes a vapor transport method. An exemplary embodiment of such a method includes putting a material element into a bottom portion of a quartz tube, heating the bottom portion containing the material element, and maintaining a top portion of the quartz tube at a low temperature to induce a solid state reaction at a low temperature while the material element is evaporated, thereby growing a crystal.

Exemplary embodiments of the compound of Chemical Formula 1 may be prepared using any one of the various methods described above without limitation.

If two-band conduction where electrons and holes co-exist occurs by optimizing current density by selectively doping elements in the method of preparing the compound of Chemical Formula 1, a thermoelectric material having a large power factor and very low thermal conductivity may be prepared since either of the electrons or holes have conductivity.

When doped with an element, the thermoelectric material includes A' and/or B' as a doping element, and accordingly, has an optimized current density, resulting in increased electrical conductivity. That is, if an A site is substituted with the doping element A' or a B site is substituted with the doping element B', the current density of either of the holes or electrons is increased. As a result, a compensation effect of electrons and holes may be prevented, and thus electrical conductivity may be improved. Due to the improved electrical conductivity, the power factor $S^2\sigma$ is increased, thereby increasing the Seebeck coefficient.

In one exemplary embodiment, the doping process may be performed by adding the doping component as a part of the material element in the polycrystalline synthesis or single crystal growth.

Meanwhile, in one exemplary embodiment, a high densification process may further be conducted in addition to the doping process in the compound having the polycrystalline structure. Due to the high densification process, electrical conductivity may further be improved.

Exemplary embodiments of the high densification process may be classified into the following three groups.

(1) One exemplary embodiment of the high densification process includes a hot press method. In one exemplary embodiment, the hot press method includes adding a powered compound to a mold, and molding the compound at a high temperature, for example, at about 300° C. to about 800° C., at a high pressure, for example, at about 30 MPa to about 300 MPa.

(2) Another exemplary embodiment of the high densification process includes spark plasma sintering. In one exemplary embodiment, the spark plasma sintering method includes passing a high-voltage current at a high pressure, for example, about 50 Amps to about 500 Amps under applying pressure at about 30 MPa to about 300 MPa, through a powdered compound to sinter the material in a short period of time.

(3) Another exemplary embodiment of the high densification process includes hot forging. In one exemplary embodiment, the hot forging method includes extrusion molding and processing a powdered compound at a high temperature, for example, at about 300° C. to about 700° C.

Due to the high densification process, the thermoelectric material has a density which is about 70% to about 100% of the theoretical density. The theoretical density can be calculated by the molecular weight divided by the atomic volume, estimated by the lattice constants. In one exemplary embodiment, the thermoelectric material has a density which is about 95% to about 100% of the theoretical density. Thus, electric conductivity is increased.

An exemplary embodiment of the compound of Chemical Formula 1 has low thermal conductivity, a high Seebeck coefficient, and excellent electrical conductivity by controlling the lattice structure, preventing a compensation effect of electrons and holes by injecting electrons and holes using selective doping, and optimizing the current density. Thus, exemplary embodiments of the compound of Chemical Formula 1 may have excellent properties suitable for a thermoelectric material.

According to another exemplary embodiment, an exemplary embodiment of a thermoelectric element may be prepared by cutting and processing the thermoelectric material.

Exemplary embodiments of the thermoelectric element may be a p-type or an n-type thermoelectric element. The thermoelectric material may be processed, for example in one exemplary embodiment, in a rectangular parallelepiped shape to form the thermoelectric element.

Figure 2:
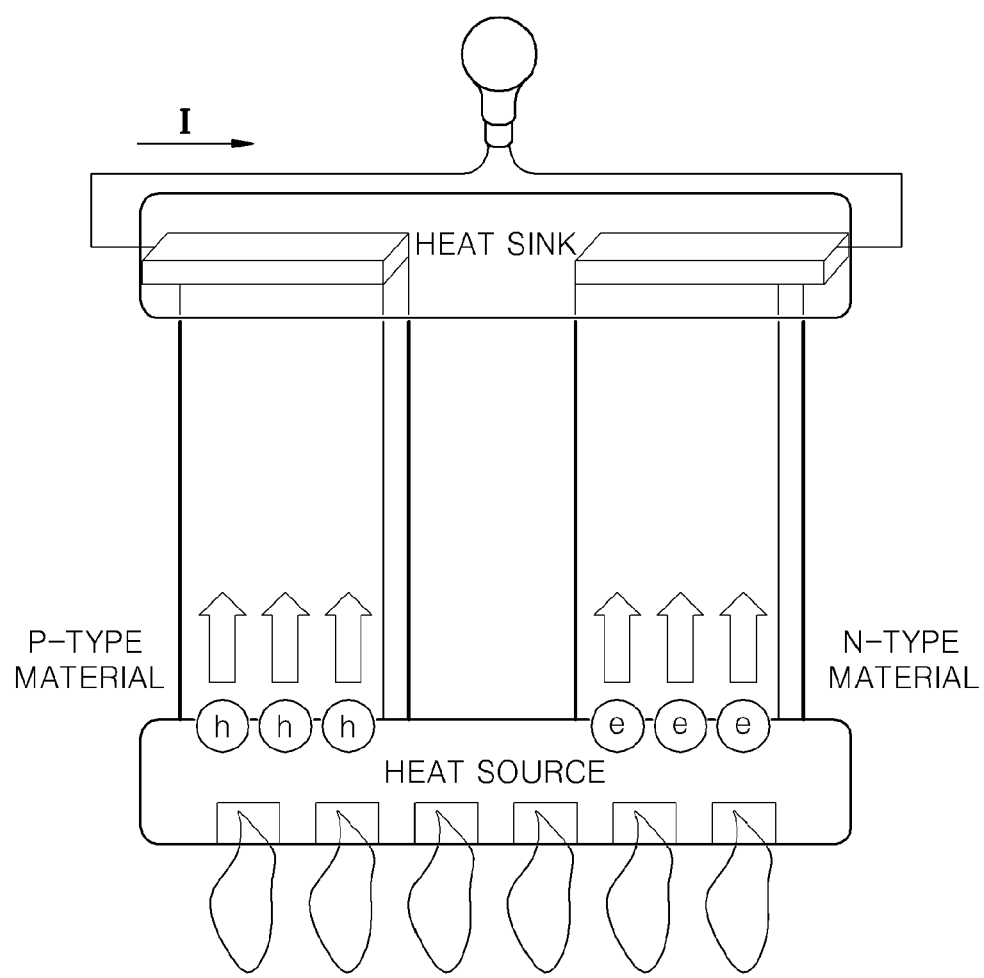
FIG. 2 is a schematic diagram illustrating thermoelectric power generation using the Seebeck effect.

Meanwhile, a thermoelectric device may be a device having cooling effects by using a current supply as shown in FIG. 1 or a device having power generation effects using a temperature difference as shown in FIG. 2.

Figure 4:
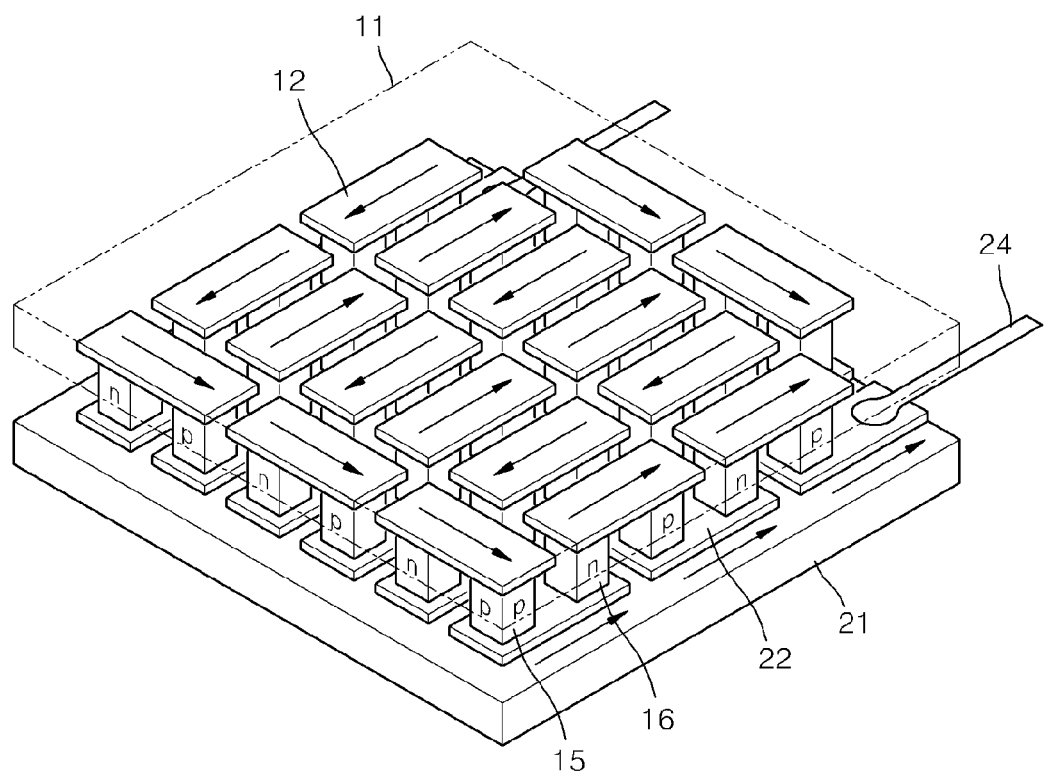
FIG. 4 illustrates an exemplary embodiment of a thermoelectric module

FIG. 4 illustrates an exemplary embodiment of a thermoelectric module using the exemplary embodiment of a thermoelectric element. As shown in FIG. 4, an upper electrode 12 and a lower electrode 22 are respectively patterned on an upper insulating substrate 11 (shown in a dotted-line for ease of viewing) and a lower insulating substrate 21. A p-type thermoelectric element 15 and an n-type thermoelectric element 16 are in contact with the upper electrode 12 and the lower electrode 22. The upper and lower electrodes 12 and 22 are connected to the exterior of the thermoelectric device via a lead electrode 24.

Exemplary embodiments also include thermoelectric devices. One such exemplary embodiment of a thermoelectric device includes; a first electrode, a second electrode, and a thermoelectric material disposed between the first electrode and the second electrode and represented by Chemical formula 1, similar to the configuration illustrated in FIG. 1 and FIG. 2. In one exemplary embodiment, a thermoelectric device further includes an insulating substrate on which at least one of the first electrode and the second electrode is disposed, similar to the configuration illustrated in FIG. 4. In one exemplary embodiment, one of the first electrode and the second electrode is configured to be exposed to a heat source similar to the configuration illustrated in FIG. 1 and FIG. 2. In one exemplary embodiment of a thermoelectric device, one of the first electrode and the second electrode is electrically connected to a power source, similar to the configuration illustrated in FIG. 1, or to the exterior of the thermoelectric device, for example to an electric device which consumes power or stores power (e.g., battery).

In one exemplary embodiment of a thermoelectric device, x is equal to 0. In one exemplary embodiment of a thermoelectric device, at least one of a and b is greater than 0. In one exemplary embodiment of a thermoelectric device, at least one of x and y is not equal to 0. In one exemplary embodiment of a thermoelectric device x is greater than 0 and less than 1. In one exemplary embodiment of a thermoelectric device y is greater than 0 and less than 1. In one exemplary embodiment of a thermoelectric device, A is at least one of In and Ga. In one exemplary embodiment of a thermoelectric device B is at least one of Se and Te.

In one exemplary embodiment of a thermoelectric device the thermoelectric material has a thermal conductivity less than or equal to about 2 W/mK at room temperature. In one exemplary embodiment of a thermoelectric device the thermoelectric material has an absolute Seebeck coefficient greater than or equal to about 220 W/mK at room temperature. In one exemplary embodiment of a thermoelectric device the thermoelectric material has an absolute Seebeck coefficient greater than or equal to about 220 W/mK at high temperature, e.g., about 450 K.

In one exemplary embodiment of a thermoelectric device the thermoelectric material has a lattice distortion. In one exemplary embodiment of a thermoelectric device the thermoelectric material has one of a single crystalline structure and a polycrystalline structure. In one exemplary embodiment of a thermoelectric device the thermoelectric material has a single crystalline structure and is cut in a direction substantially perpendicular to a growth direction of the crystalline structure.

In one exemplary embodiment of a thermoelectric device a p-type thermoelectric material and a n-type thermoelectric material are alternately arranged, and at least one of the p-type thermoelectric material and the n-type thermoelectric material include the chalcogenide compound of Chemical Formula 1, similar to the configuration illustrated in FIG. 4.

Exemplary embodiments also include an apparatus including; a heat source, and a thermoelectric device including a thermoelectric material which absorbs heat from the heat source and comprises the chalcogenide compound represented by Chemical Formula 1, a first electrode in contact with the thermoelectric material, and a second electrode disposed substantially opposite the first electrode and in contact with the thermoelectric material.

In one exemplary embodiment of an apparatus one of the first electrode and the second electrode is configured to be in contact with a heat source.

Exemplary embodiments of the apparatus include configurations further including a power source electrically connected to one of the first electrode and the second electrode. Exemplary embodiments of the apparatus include configurations further including an electric device consuming or storing power electrically connected to one of the first electrode and the second electrode.

Exemplary embodiments of the upper and lower insulating substrates 11 and 21 may include a GaAs, sapphire, silicon, Pyrex, or quartz substrate. Exemplary embodiments of the upper and lower electrodes 12 and 22 may be formed of Al, Ni, Au, Ti, or other similar materials. The size of the upper and lower electrodes 12 and 22 are not limited. The upper and lower electrodes 12 and 22 may be patterned using a known method, for example, in one exemplary embodiment a lift-off process for semiconductor fabrication, deposition, or photolithography, or a combination thereof, may be employed.

As described above, the thermoelectric module may be a thermoelectric cooling system and/or a thermoelectric power generation system. The thermoelectric cooling system may be a micro cooling system, a universal cooling device, an air conditioner, and/or a waste heat recovery system, but is not limited thereto. The configuration of the thermoelectric cooling system and a method of preparing the thermoelectric cooling system are well known in the art, and thus will not be described herein.

Hereinafter, the present invention will be described more specifically with reference to the following examples. The following examples are for illustrative purposes only and are not intended to limit the scope of the invention.

EXAMPLE 1

In, Sn and Se, as material elements, were quantified to meet a stoichiometric molar ratio of $In_{4-c}Sn_cSe_3$ (wherein c variously equaled 0, 0.1, 0.2, 0.4, and 0.5) and were added to a quartz tube. The quartz tube was sealed in a vacuum using a hydrogen torch and heat treated at 500° C. for 24 hours. A melt ingot was pulverized to prepare metal powder, and the metal powder was compressed at 3 tons in a cold press mold.

The resultant was sintered at 520° C. for 24 hours. The resultant was further pulverized to obtain a metal powder having uniformity and sufficient density. The metal powder was subjected to a spark sintering process by pressing the metal powder at 70 MPa at a temperature of about 480° C. to about 500° C. for 1 hour to prepare $In_4Se_3$, $In_{3.9}Sn_{0.1}Se_3$, $In_{3.8}Sn_{0.2}Se_3$, $In_{3.6}Sn_{0.4}Se_3$, and $In_{3.5}Sn_{0.5}Se_3$ according to the various values of c mentioned above.

A single crystalline sample was prepared using the Bridgeman method. In and Se were added to quartz tubes in molar ratios of 68:32 and 57:43, and the quartz tubes were sealed in a vacuum. The quartz tubes were added to a Bridgeman furnace and maintained at 600° C. for 72 hours. Then, crystals grew by pulling the quartz tubes at 1.5 mm/hr. The composition of the single crystalline compounds was measured using ICP and energy dispersive X-ray spectroscopy ("EDS"). According to the results, the compounds had single crystalline structures of $In_4Se_{2.78}$ and $In_4Se_{2.35}$.

Experimental Example 1

Measurement of Density

The density of $In_4Se_3$, $In_{3.9}Sn_{0.1}Se_3$, $In_{3.8}Sn_{0.2}Se_3$, $In_{3.6}Sn_{0.4}Se_3$, and $In_{3.5}Sn_{0.5}Se_3$ prepared according to Example 1 was measured based on Archimedes' principle and compared with theoretical densities thereof, and the results are shown in Table 1 below.

TABLE 1

| $In_{4-c}Sn_cSe_3$ | Theoretical density (g/cm³) | Measured density (g/cm³) | Rate (%) |
| --- | --- | --- | --- |
| c = 0.0 | 6.032 | 5.92 | 98 |
| c = 0.1 | 6.088 | 6.01 | 98 |
| c = 0.2 | 6.064 | 5.88 | 97 |
| c = 0.4 | 6.088 | 5.96 | 98 |
| c = 0.5 | 6.080 | 5.92 | 97 |

As shown in Table 1, the thermoelectric materials prepared according to Example 1 had densities which are about 97% to about 98% of its theoretical densities. Thus, it can be seen that the thermoelectric material is densely formed.

Experimental Example 2

Measurement of Thermal Conductivity

Figure 5A:
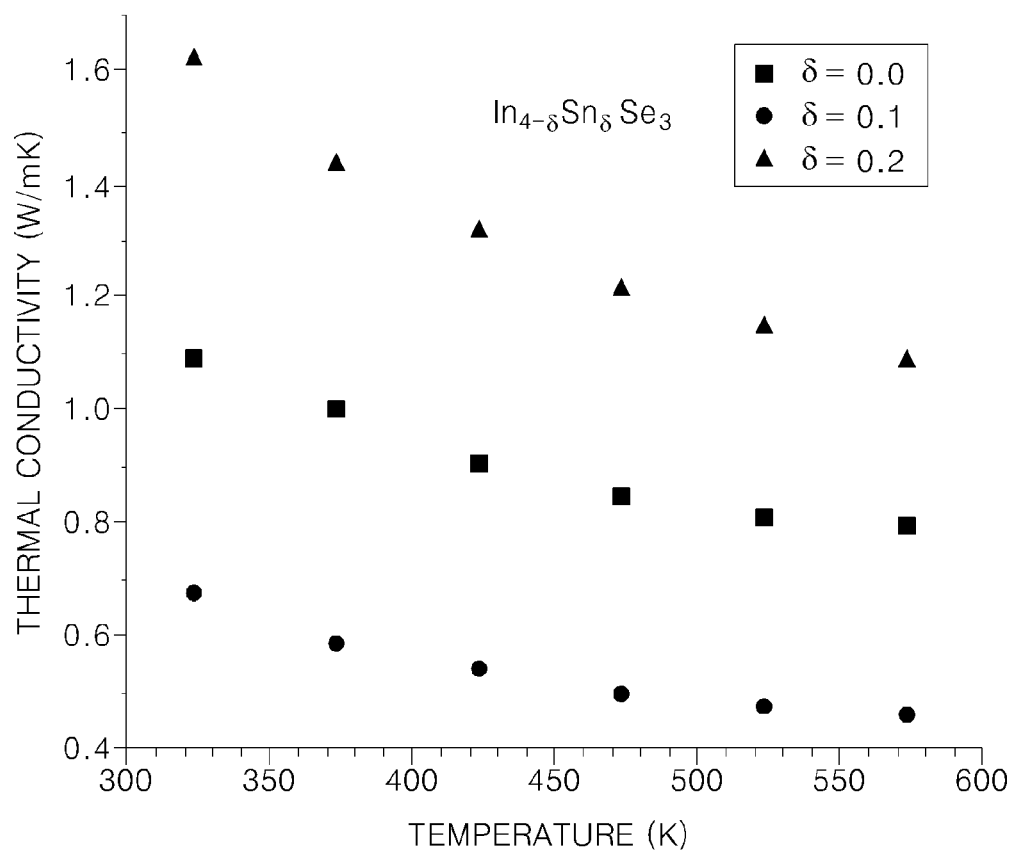
FIG. 5A is a graph illustrating thermal conductivity of an exemplary embodiment of a polycrystalline thermoelectric material.
Figure 5B:
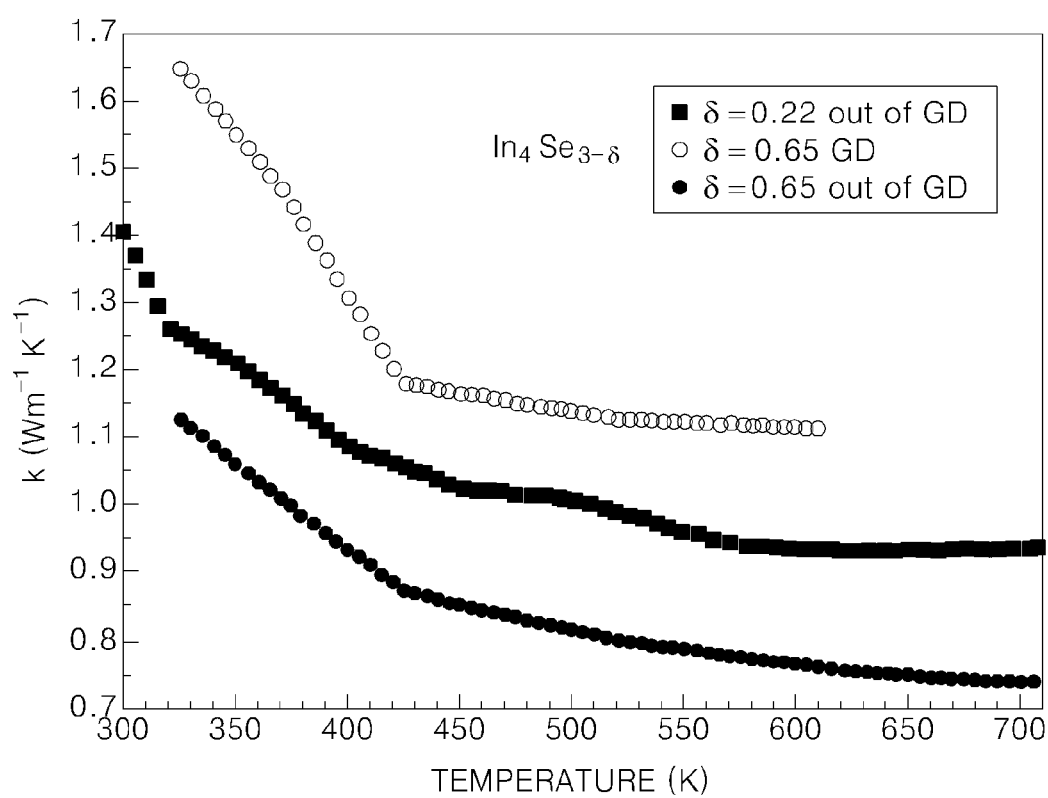
FIG. 5B is a graph illustrating thermal conductivity of an exemplary embodiment of a single crystalline thermoelectric material, wherein the label "out of GD" indicates a thermoelectric material cut in a direction substantially perpendicular to a growth direction, and the label "GD" indicates a thermoelectric material cut substantially in the growth direction as will be discussed in more detail below.

The thermal conductivity of $In_4Se_3$, $In_{3.9}Sn_{0.1}Se_3$, and $In_{3.8}Sn_{0.2}Se_3$ prepared according to Example 1 was measured using a hot disk method, and the results are shown in FIG. 5A. The thermal conductivity of single crystalline compounds of $In_4Se_{2.78}$ and $In_4Se_{2.35}$ were measured in the same manner, and the results are shown in FIG. 5B. As shown in FIGS. 5A and 5B, the thermoelectric material had the thermal conductivity of about 0.7 W/mK to about 1.7 W/mK at 300 K and the thermal conductivity decreases as the temperature increases. In addition, the thermal conductivity when the thermoelectric material was cut in a direction substantially perpendicular to the growth direction (out of GD) was less than that when the thermoelectric material was cut substantially in the growth direction (GD) as shown in FIG. 5B.

Experimental Example 3

Measurement of Seebeck Coefficient

Figure 6A:
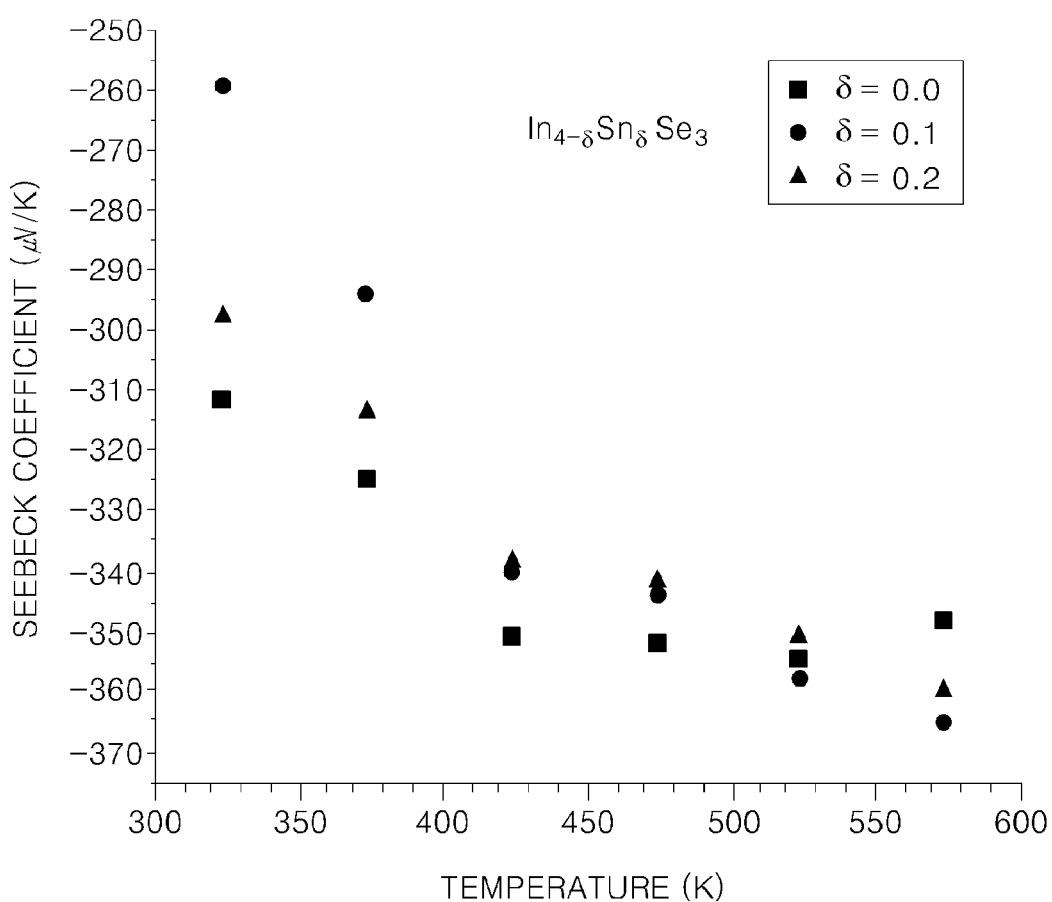
FIG. 6A is a graph illustrating Seebeck coefficients of an exemplary embodiment of a polycrystalline thermoelectric material.
Figure 6B:
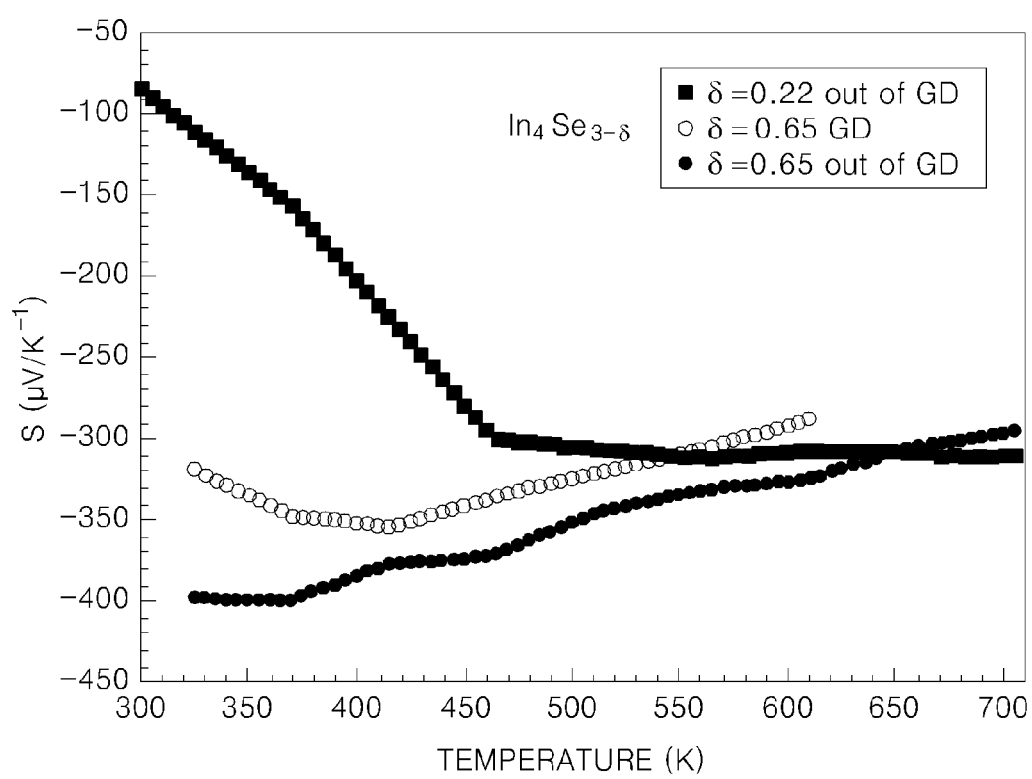
FIG. 6B is a graph illustrating Seebeck coefficients of an exemplary embodiment of a single crystalline thermoelectric material, wherein the label "out of GD" indicates a thermoelectric material cut in a direction substantially perpendicular to a growth direction, and the label "GD" indicates a thermoelectric material cut substantially in the growth direction.

The Seebeck coefficient of $In_4Se_3$, $In_{3.9}Sn_{0.1}Se_3$ and $In_{3.8}Sn_{0.2}Se_3$ prepared according to Example 1 was measured using a 4 point contact method, and the results are shown in FIG. 6A. The Seebeck coefficient of single crystalline compounds of $In_4Se_{2.78}$ and $In_4Se_{2.35}$ were measured in the same manner, and the results are shown in FIG. 6B. As shown in FIGS. 6A and 6B, the thermoelectric material had an absolute Seebeck coefficient of more than about 220 μV/K at high temperature, e.g., 450 K and examples of the thermoelectric material had an absolute Seebeck coefficient of about 260 μV/K to about 310 μV/K at 300K. In addition, the absolute Seebeck coefficient when the thermoelectric material was cut in a direction substantially perpendicular to the growth direction (out of GD) was greater than that when the thermoelectric material was cut substantially in the growth direction (GD) as shown in FIG. 6B.

Experimental Example 4

Measurement of Electrical Resistance

Figure 7A:
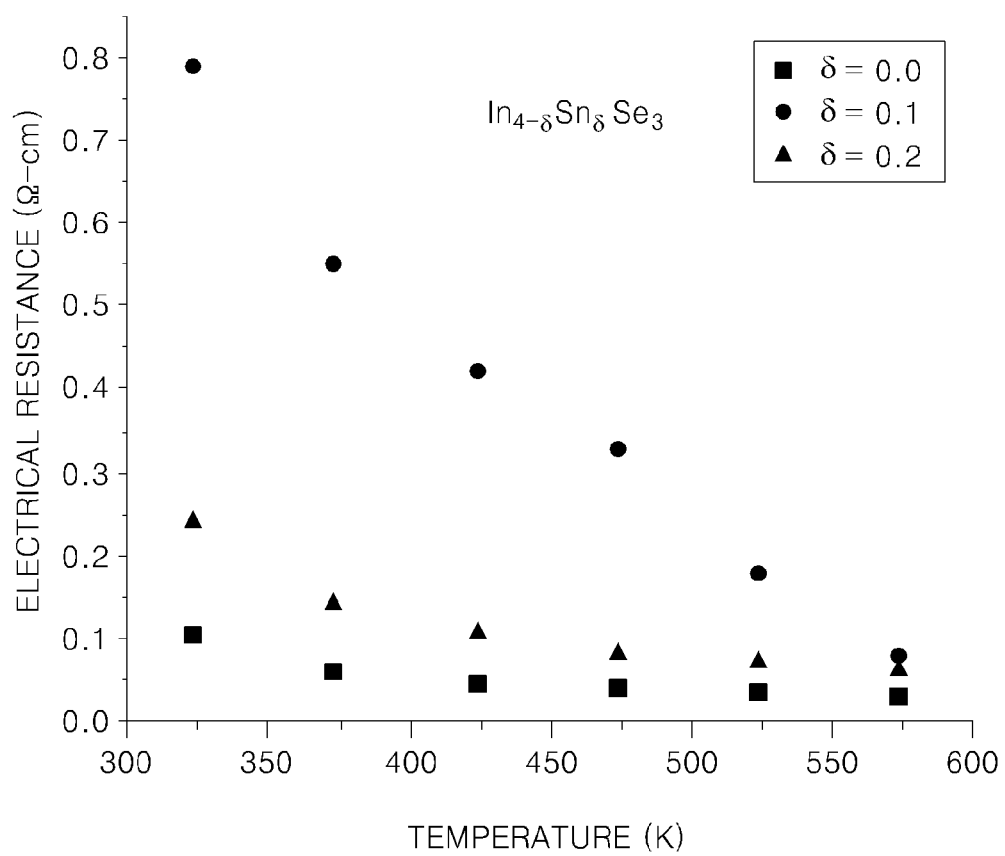
FIG. 7A is a graph illustrating electrical resistance of an exemplary embodiment of a polycrystalline thermoelectric material.
Figure 7B:
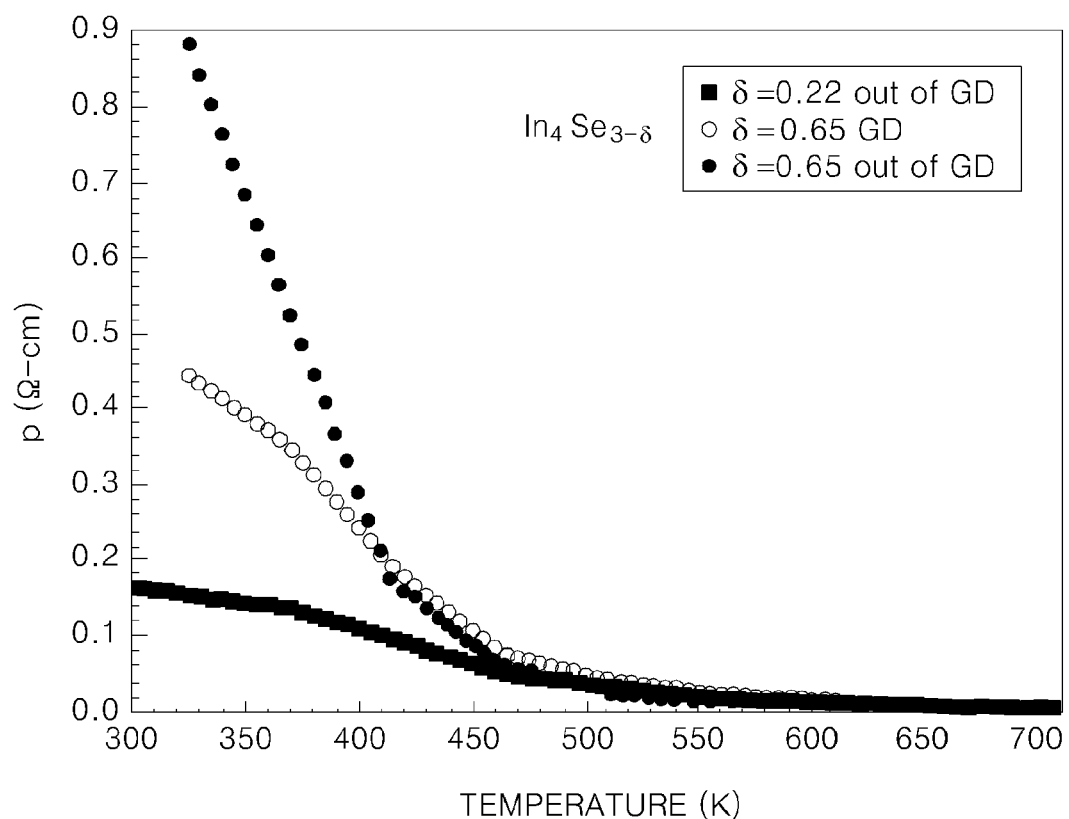
FIG. 7B is a graph illustrating electrical resistance of an exemplary embodiment of a single crystalline thermoelectric material, wherein the label "out of GD" indicates a thermoelectric material cut in a direction substantially perpendicular to a growth direction, and the label "GD" indicates a thermoelectric material cut substantially in the growth direction.

The electrical resistance of $In_4Se_3$, $In_{3.9}Sn_{0.1}Se_3$ and $In_{3.8}Sn_{0.2}Se_3$ prepared according to Example 1 was measured using a 4 point contact AC transport method, and the results are shown in FIG. 7A. The electrical resistance of single crystalline compounds of $In_4Se_{2.78}$ and $In_4Se_{2.35}$ were measured in the same manner, and the results are shown in FIG. 7B. As shown in FIGS. 7A and 7B, the electrical resistance decreases as the temperature increases. The thermoelectric material has low electrical resistance. In addition, the electrical conductivity may be changed according to the orientation of the crystal in the single crystalline structure as shown in FIG. 7B.

Experimental Example 5

Measured Figure-of-Merit ZT

Figure 8A:
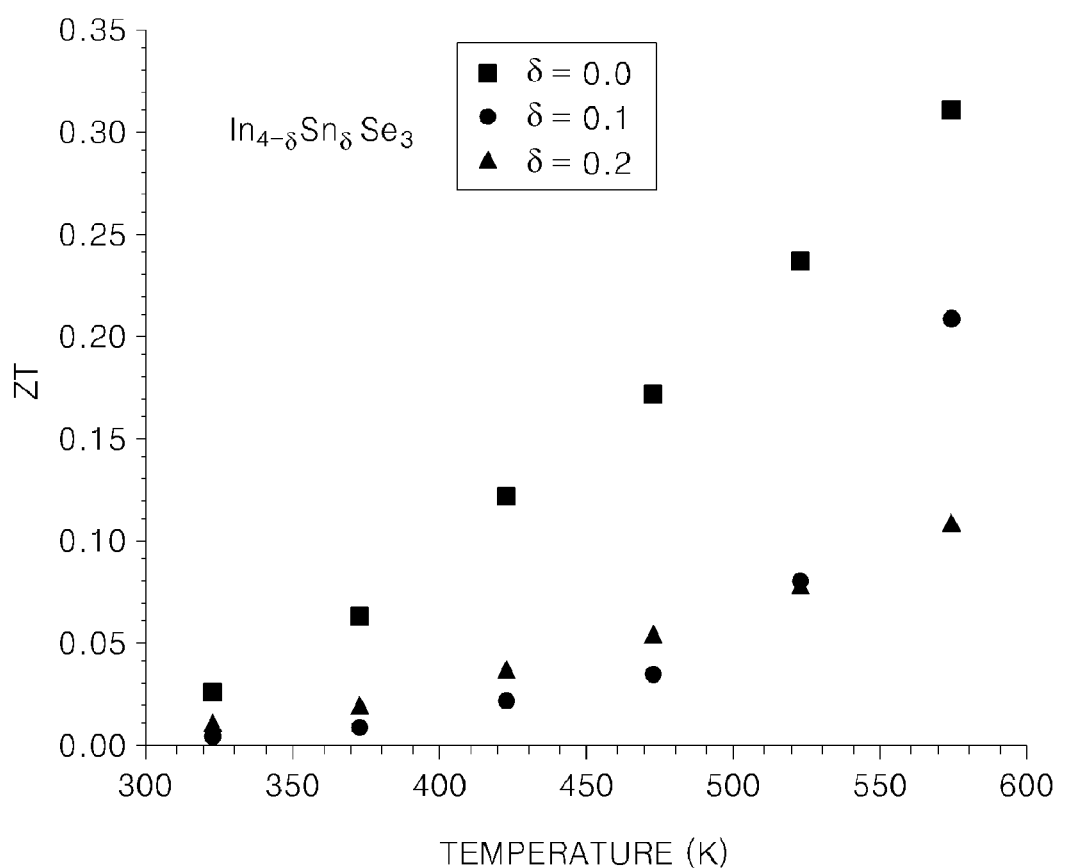
FIG. 8A is a graph illustrating a figure-of-merit ZT of an exemplary embodiment of a polycrystalline thermoelectric material.
Figure 8B:
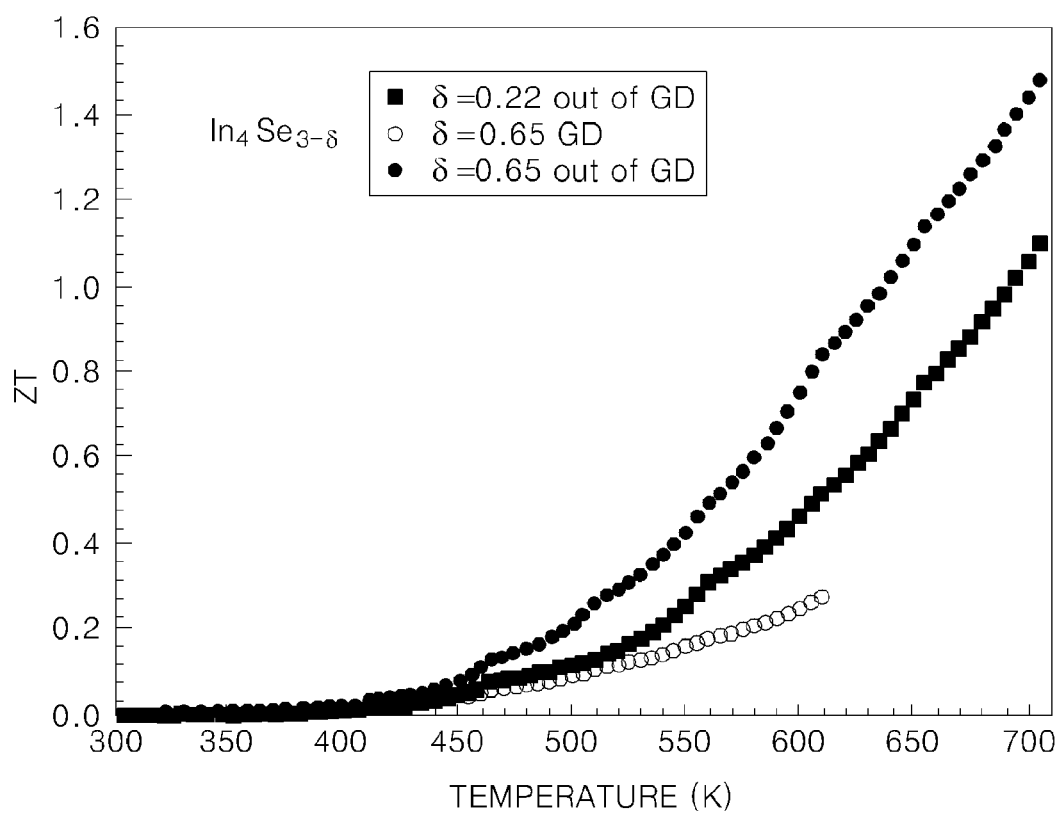
FIG. 8B is a graph illustrating a figure-of-merit ZT of an exemplary embodiment of a single crystalline thermoelectric material, wherein the label "out of GD" indicates a thermoelectric material cut in a direction substantially perpendicular to a growth direction, and the label "GD" indicates a thermoelectric material cut substantially in the growth direction.

Figure-of-merit ZT of $In_4Se_3$, $In_{3.9}Sn_{0.1}Se_3$ and $In_{3.8}Sn_{0.2}Se_3$ prepared according to Example 1 was calculated using Mathematical Formula 1 above, and the results are shown in FIG. 8A. As shown in FIG. 8A, ZT of the thermoelectric material is increased as the temperature is increased. According to FIG. 8A and FIG. 8B, the ZT of the single crystalline compounds was greater than that of polycrystalline compounds and the ZT of the $In_4Se_{3-\delta}$ (0<δ<1) compounds, e.g., $In_4Se_{2.35}$ and $In_4Se_{2.35}$, is higher than $In_4Se_3$, especially at high temperature. The ZT of the single crystalline compounds was between about 1.1 to about 1.48 at 705 K as shown in FIG. 8B along the out-of-growth direction of crystal. In addition, the ZT when the thermoelectric material was cut in a direction substantially perpendicular to the growth direction (out of GD) was greater than that when the thermoelectric material was cut in the growth direction (GD) in the single crystalline structure.

EXAMPLE 2

In the present example embodiment, In and Se were quantified to meet a molar ratio of $In_4Se_{3-\delta}$ (δ=0.02, 0.05, 0.1, 0.2, and 0.5) and added to a quartz tube. The quartz tube was sealed in a vacuum. The sealed quartz was heat treated at 550° C. for 24 hours. A melt ingot was ground to prepare metal powder, and the metal powder was sealed in a quartz tube and sintered at 500° C. for 24 hours. To increase the density, the sintered resultant was further ground, and the resultant powder was subjected to a spark plasma sintering process in a carbon mold by pressing the power at 70 MPa at a temperature of about 420° C. for 5 minutes to prepare a thermoelectric material.

Figure 9A:
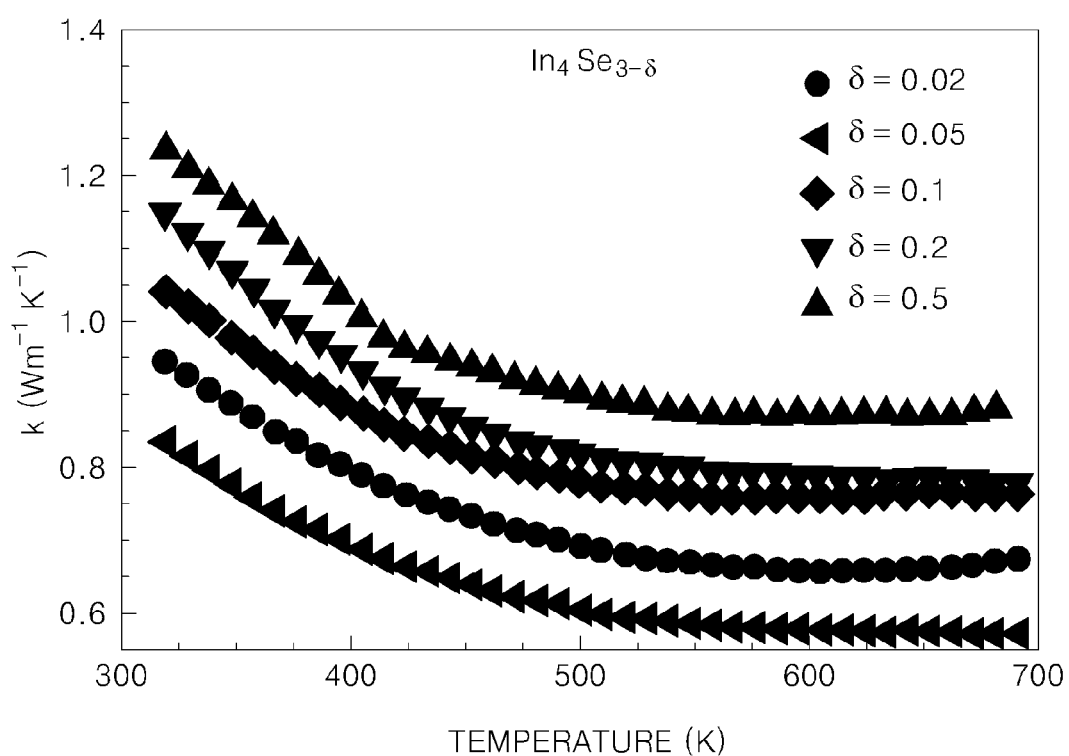
FIG. 9A illustrates thermal conductivity of exemplary embodiments of materials according to the formula $In_4Se_3$-$\delta$ according to temperature.
Figure 9B:
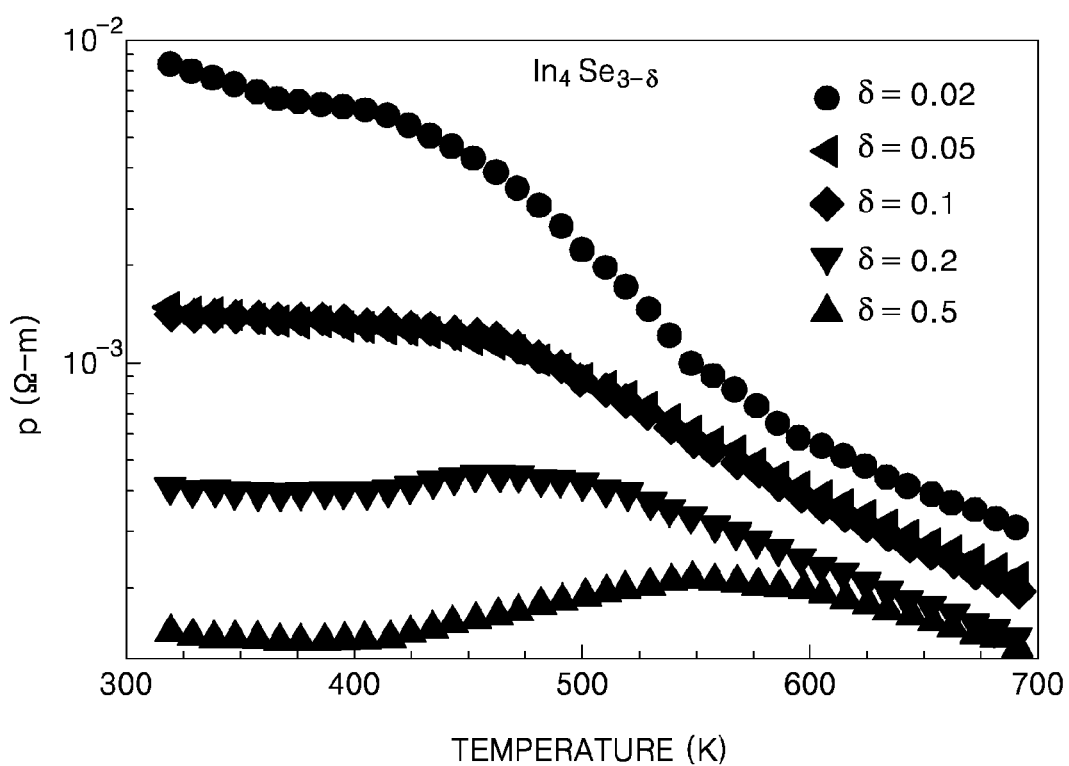
FIG. 9B illustrates electrical resistance of exemplary embodiments of materials according to the formula $In_4Se_{3-\delta}$ according to temperature.
Figure 9C:
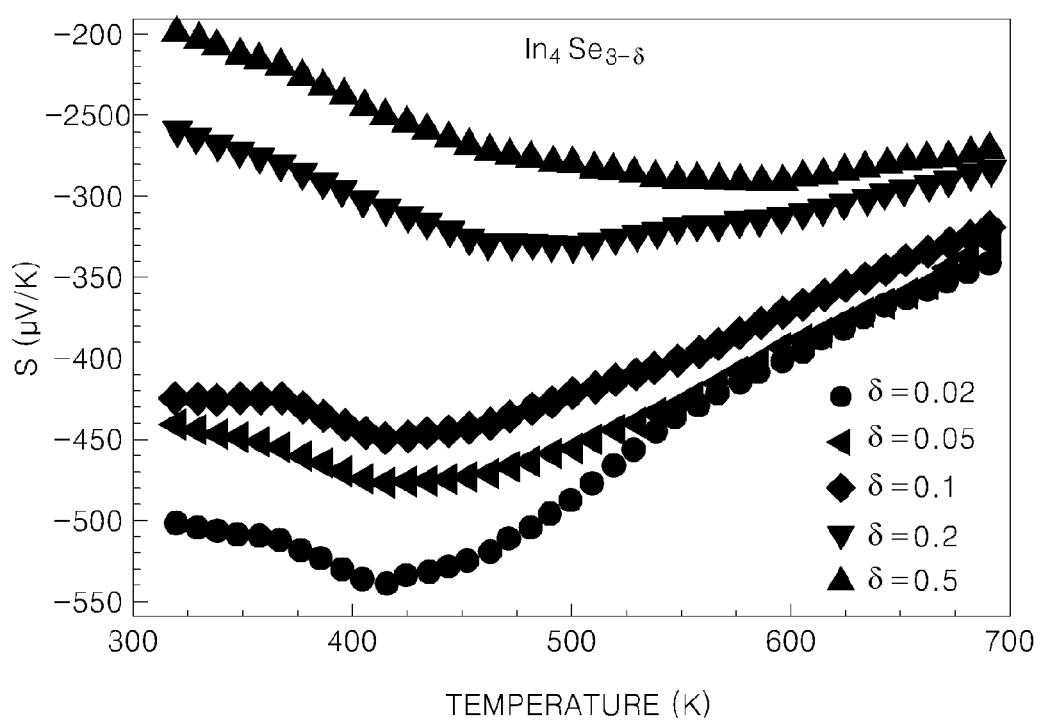
FIG. 9C illustrates Seebeck coefficient of exemplary embodiments of materials according to the formula $In_4Se_{3-\delta}$ according to temperature.

Thermal conductivity, electrical resistance, and Seebeck coefficient of the thermoelectric material prepared according to Example 2 were measured, and the results are shown in FIGS. 9A, 9B, and 9C.

The $In_4Se_{3-\delta}$ ($0<\delta<1$) compounds have low thermal conductivity, high electrical conductivity, and high Seebeck coefficient. The thermal conductivity decreases as the temperature increases.

Figure 10A:
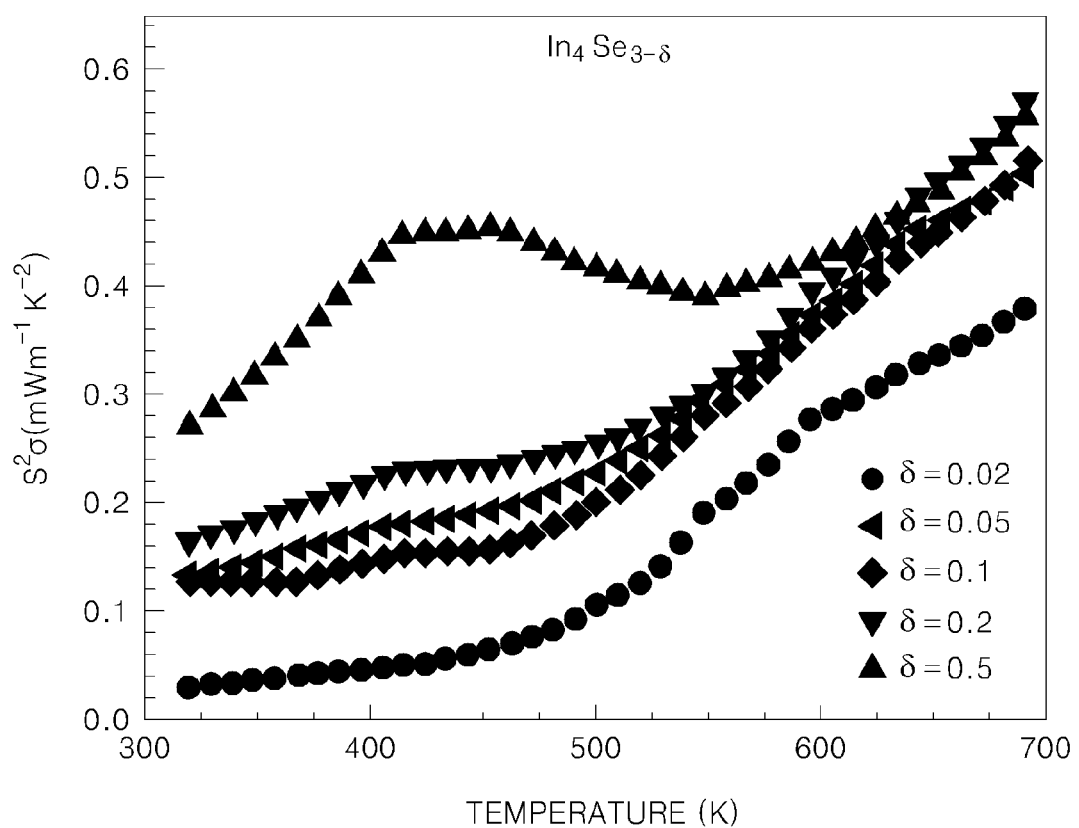
FIG. 10A illustrates power factor of exemplary embodiments of materials according to the formula $In_4Se_{3-\delta}$ according to temperature.
Figure 10B:
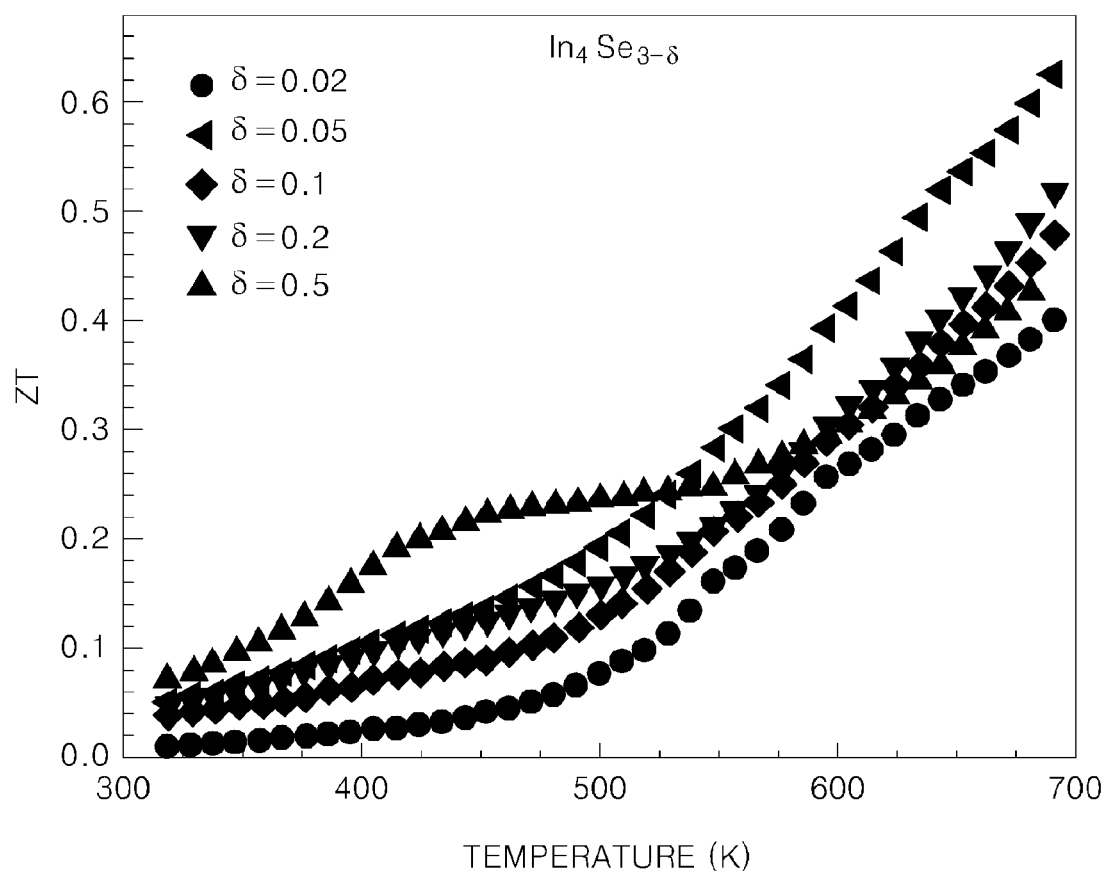
FIG. 10B illustrates ZT of exemplary embodiments of materials according to the formula $In_4Se_{3-\delta}$ according to temperature.

Power factor and ZT of the thermoelectric material prepared according to Example 2 were measured, and the results are shown in FIGS. 10A and 10B. The thermoelectric material, e.g., $In_4Se_{3-\delta}$ ($0<\delta<1$) compounds, shows a tendency that the Power factor and ZT increase as the temperature increases. When $\delta=0.05$, ZT was 0.63 at 710 K due to low thermal conductivity.

Figure 11A:
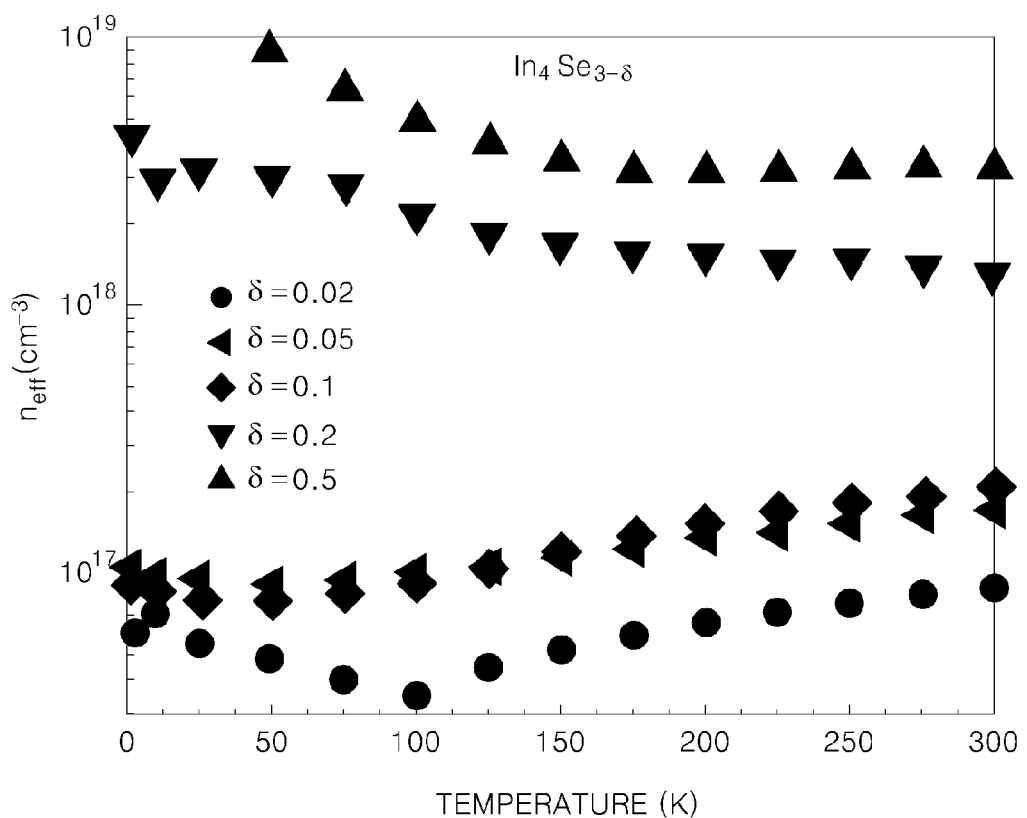
FIG. 11A illustrates current density of exemplary embodiments of materials according to the formula $In_4Se_{3-\delta}$ according to temperature.
Figure 11B:
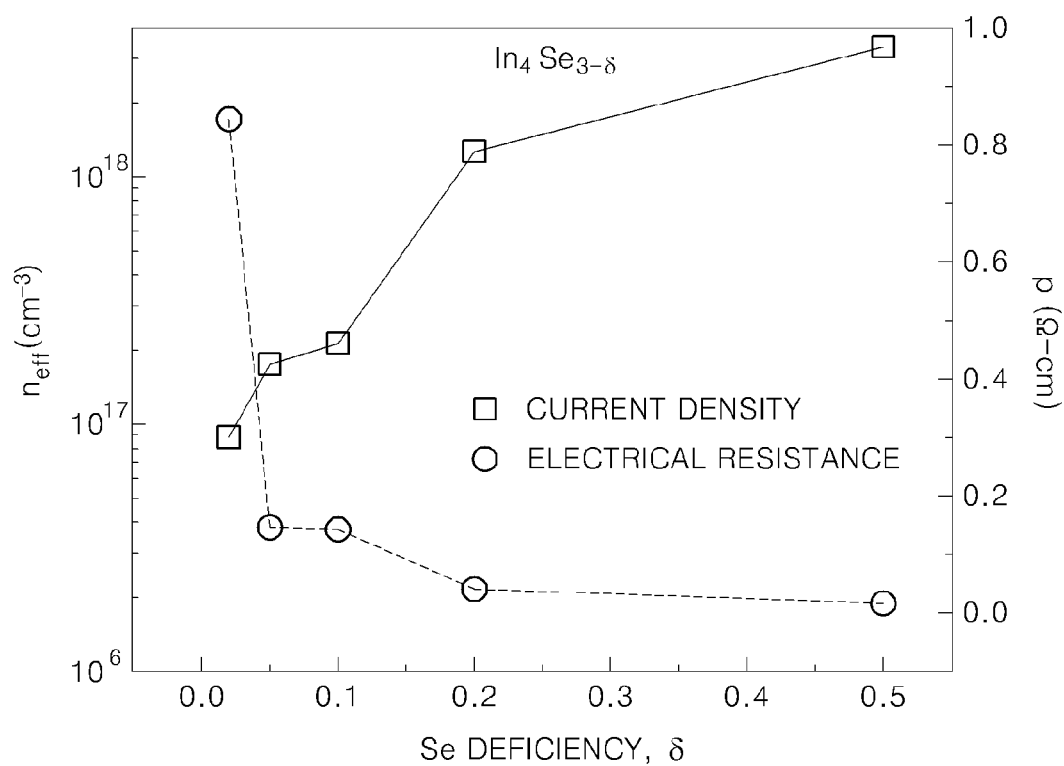
FIG. 11B illustrates current density of exemplary embodiments of materials according to the formula $In_4Se_{3-\delta}$ at 320 K according to an amount of a Se-deficiency $\delta$.

Current density and Hall resistance according to temperature of the thermoelectric material prepared according to Example 2 were measured, and the results are shown in FIGS. 11A and 11B. The current density changes according to an amount of a Se-deficiency, $\delta$, in $In_4Se_{3-\delta}$ compounds ($0<\delta<1$). As Se deficiency increases, e.g., the value of $\delta$ increases, current density increases and electrical resistance decreases.

The current density may be calculated as follows. 1T(B) magnetic field is applied in perpendicular direction to sample plate at between 0 and 320 K. 1 mA current ($I_{xx}$) is applied and a voltage ($V_{xy}$) is measured in perpendicular direction to the current. (Herein x-axis and y-axis are on the sample plate and x-axis is equal to a direction of the current.) Carrier density $n_{eff}$ is calculated by:

Current Carrier density $n_{eff}(cm^{-3})=-1/(RH*e)$, wherein, $e=1.602\times10^{-19}$ C; Hall coefficient $RH(m^3/C)=R_{xy}/B$; Hall resistance $R_{xy}$ (Ohm-m)=$V_{xy}/I_{xx}$.

Thermoelectric properties of conventional thermoelectric materials $Bi_2Te_3$, and $Yb_{0.02}Co_4Sb_{12}$ were compared with those of polycrystalline $In_4Se_{2.95}$, single crystalline $In_4Se_{2.78}$ and $In_4Se_{2.35}$ according to Example 1 and 2, and the results are shown in Table 2 below. The value of $In_4Se_{2.95}$, $In_4Se_{2.78}$ and $In_4Se_{2.35}$ is represented at temperature where ZT is maximum. The value of $Bi_2Te_3$, and $Yb_{0.02}Co_4Sb_{12}$ is from Physical Review B vol. 64, p. 241104(R), 2001.

TABLE 2

| Thermoelectric material | $K_{tot}$ (W/mK) | Electrical resistance (mΩ-cm) | Seebeck coefficient (μV/K) | ZT |
|---|---|---|---|---|
| $Bi_2Te_3$ | 2.9 | 1.2 | 210 | 0.85 |
| $Yb_{0.02}Co_4Sb_{12}$ | 4.5 | 0.6 | −150 | 0.3 |
| Polycrystalline $In_4Se_{2.95}$ | 0.7 | 300 | −348 | 0.63 |
| Single crystalline $In_4Se_{2.78}$ | 0.94 | 6.6 | −310 | 1.1 |
| Single crystalline $In_4Se_{2.35}$ | 0.74 | 5.7 | −295 | 1.48 |

The thermoelectric material according to Example 1 and Example 2, e.g., $In_4Se_{3-\delta}$ ($0<\delta<1$), has a high Seebeck coefficient and low thermal conductivity when compared with conventionally and commercially used thermoelectric materials which include $Bi_2Te_3$. Thus, the thermoelectric material can be used in refrigerant-free refrigerators, air conditioners, waste heat power generation, thermoelectric nuclear power conversion for military and aerospace applications, micro cooling systems, and other similar applications.

The thermoelectric material according to Example 1 and Example 2 may be used as a p-type thermoelectric material in a thermoelectric device. For n-type thermoelectric material to be used in conjunction with the thermoelectric material of Example 1 and Example 2, Ti doped PbTe (e.g., $Ti_{0.02}Pb_{0.98}Te$) could be used.

To prepare $Ti_{0.02}Pb_{0.98}Te$, TI, Pb and Se may be quantified and added to a quartz tube. The quartz tube may be sealed in a vacuum and heat treated at 1000° C. for 24 hours. And then, the quartz tube may be cooled to 520° C. and annealed for one week. In order to increase the density of the melt sample, the melt sample may be pulverized and heat treated in a carbon mold at 520° C., at 70 MPa for 5 minutes. The prepared $Ti_{0.02}Pb_{0.98}Te$ may be cut into pieces having the size of 0.6 (W)×0.6(H)×1.12(L) mm³ to prepare an n-type thermoelectric element.

This $Ti_{0.02}Pb_{0.98}Te$ could be used in conjunction with the $In_4Se_{2.35}$ prepared according to Example 1 to prepare a thermoelectric device. The thermoelectric device may include two insulating substrates. For the insulating substrate, $Al_2O_3$ could be used. The insulating substrate may include metal electrode, e.g. Cu electrode, on it. A metal electrode may be disposed on an insulating substrate and heat-treated in an oxygen atmosphere at a temperature ranging from 1250° C. to 1300° C. If Cu is used as a metal electrode, the Cu electrode may be polished to remove an oxide layer formed on it. A solder paste (e.g., PbSn eutectic solder) may be printed after covering the electrode with a mask.

The p-type thermoelectric element (for example, the $In_4Se_{2.35}$ prepared according to Example 1) may be placed alternately with the n-type thermoelectric element (for example, $Ti_{0.02}Pb_{0.98}Te$) in a thermoelectric device. The $In_4Se_{2.35}$ prepared according to Example 1 and the prepared $Ti_{0.02}Pb_{0.98}Te$ may be placed on metal electrodes of one of the insulating substrates using a solder paste. And then, the other insulating substrate having metal electrodes may be placed on the alternately-arranged p-type and n-type thermoelectric elements using a solder paste and heat-treated at a temperature ranging from 200° C. to 300° C. for 10 minutes to prepare a thermoelectric device. Finally, lead wires may be connected to the metal electrode.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A thermoelectric material comprising a chalcogenide compound represented by the following formula:

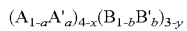

$(A_{1-a}A'_a)_{4-x}(B_{1-b}B'_b)_{3-y}$ wherein A is a Group XIII element, and A' is at least one selected from a group consisting of a Group XIII element, a Group XIV element, a rare earth element, a transition metal, and combinations thereof, wherein A and A' are different from each other;

wherein B is at least one selected from a group consisting of S, Se, Te and combinations thereof, and B' is at least one selected from a group consisting of elements of Groups XIV, XV, XVI and combinations thereof, wherein B and B' are different from each other;

wherein a is larger than 0 and less than 1;

wherein b is equal to or larger than 0 and less than 1;

wherein x is between −1 and 1; and wherein y is between −1 and 1.

2. The thermoelectric material of claim 1, wherein at least one of x and y is not equal to 0.

3. The thermoelectric material of claim 1, wherein an absolute Seebeck coefficient thereof is equal to or greater than about 220 W/mK at room temperature.

4. The thermoelectric material of claim 1, wherein an absolute Seebeck coefficient thereof is equal to or greater than about 220 W/mK at about 450 K.

5. The thermoelectric material of claim 1, wherein x is equal to 0.

6. The thermoelectric material of claim 1, wherein x is greater than 0 and less than 1.

7. The thermoelectric material of claim 1, wherein y is greater than 0 and less than 1.

8. The thermoelectric material of claim 1, wherein A is at least one of In and Ga.

9. The thermoelectric material of claim 1, wherein the transition metal is at least one selected from a group consisting of Y, Fe, Mn, Co, Ni, Cu, Zn, Zr, Nb, Hf, Ta, and combinations thereof.

10. The thermoelectric material of claim 1, wherein B is at least one of Se and Te.

11. The thermoelectric material of claim 1, having a thermal conductivity equal to or less than about 2 W/mK at room temperature.

12. The thermoelectric material of claim 1, having a density of about 70% to about 100% of its theoretical density.

13. The thermoelectric material of claim 1, wherein a covalent bond is formed in an in-plane direction, and at least one of an ionic bond and a Van der Waals bond is formed between adjacent layers thereof.

14. The thermoelectric material of claim 1, having a lattice distortion.

15. The thermoelectric material of claim 1, having low-dimensional electrical conductivity.

16. The thermoelectric material of claim 1, having one of a single crystalline structure and a polycrystalline structure.

17. The thermoelectric material of claim 16, wherein the thermoelectric material having a single crystalline structure is cut in a direction substantially perpendicular to a growth direction of the crystalline structure.

18. A chalcogenide compound represented by the following formula:

$$(A_{1-a}A'_a)_{4-x}(B_{1-b}B'_b)_{3-y}$$

wherein A is a Group XIII element, and A' is at least one selected from a group consisting of a Group XIII element, a Group XIV element, a rare earth element, a transition metal and combinations thereof, wherein A and A' are different from each other;

wherein B is at least one selected from a group consisting of S, Se, Te and combinations thereof, and B' is at least one selected from a group consisting of elements of Groups XIV, XV, and XVI, and combinations thereof wherein B and B' are different from each other;

wherein a is larger than 0 and less than 1;

wherein b is equal to or larger than 0 and less than 1;

wherein x is between −1 and 1; and wherein y is between −1 and 1, wherein the chalcogenide compound has a lattice distortion.

19. The chalcogenide compound of claim 18, having the lattice distortion in an in-plane direction.

20. The chalcogenide compound of claim 18, wherein x is between 0 and 1.

21. The chalcogenide compound of claim 18, wherein y is between 0 and 1.

22. The chalcogenide compound of claim 18, wherein A is at least one of In and Ga.

23. The chalcogenide compound of claim 18, wherein the transition metal is at least one selected from a group consisting of Y, Fe, Mn, Co, Ni, Cu, Zn, Zr, Nb, Hf, Ta, and combinations thereof.

24. The chalcogenide compound of claim 18, wherein B is at least one of Se and Te.

25. The chalcogenide compound of claim 18, having a thermal conductivity equal to or less than about 2 W/mK at room temperature.

26. The chalcogenide compound of claim 18, having a single crystalline or polycrystalline structure.

27. A thermoelectric device, comprising:
a first electrode;
a second electrode; and
a thermoelectric material disposed between the first electrode and the second electrode, the thermoelectric material comprising a chalcogenide compound represented by the following formula:

$$(A_{1-a}A'_a)_{4-x}(B_{1-b}B'_b)_{3-y}$$

wherein A is a Group XIII element, and A' is at least one selected from a group consisting of a Group XIII element, a Group XIV element, a rare earth element, a transition metal and combinations thereof, wherein A and A' are different from each other;

wherein B is at least one selected from a group consisting of S, Se, Te, and combinations thereof and B' is at least one selected from a group consisting of elements of Groups XIV, XV, XVI and combinations thereof, wherein B and B' are different from each other;

wherein a is larger than 0 and less than 1;

wherein b is equal to or larger than 0 and less than 1;

wherein x is between −1 and 1; and wherein y is between −1 and 1.

28. The thermoelectric device of claim 27, further comprising an insulating substrate on which at least one of the first electrode and the second electrode is disposed.

29. The thermoelectric device of claim 27, wherein one of the first electrode and the second electrode is configured to be exposed to a heat source.

30. The thermoelectric device of claim 27, wherein one of the first electrode and the second electrode is coupled to a power source.

31. The thermoelectric device of claim 27, wherein x is equal to 0.

32. The thermoelectric device of claim 27, wherein at least one of x and y is not equal to 0.

33. The thermoelectric device of claim 27, wherein x is greater than 0 and less than 1.

34. The thermoelectric device of claim 27, wherein y is greater than 0 and less than 1.

35. The thermoelectric device of claim 27, A is at least one of In and Ga.

36. The thermoelectric device of claim 27, wherein B is at least one of Se and Te.

37. The thermoelectric device of claim 27, wherein the thermoelectric material has a thermal conductivity less than or equal to about 2 W/mK at room temperature.

38. The thermoelectric device of claim 27, wherein the thermoelectric material has an absolute Seebeck coefficient greater than or equal to about 220 W/mK at room temperature.

39. The thermoelectric device of claim 27, wherein the thermoelectric material has absolute Seebeck coefficient greater than or equal to about 220 W/mK at about 450 K.

40. The thermoelectric device of claim 27, wherein the thermoelectric material has a lattice distortion.

41. The thermoelectric device of claim 27, wherein the thermoelectric material has one of a single crystalline structure or a polycrystalline structure.

42. The thermoelectric device of claim 41, wherein the thermoelectric material has a single crystalline structure and is cut in a direction substantially perpendicular to a growth direction of the crystalline structure.

43. The thermoelectric device of claim 27, wherein a p-type thermoelectric material and a n-type thermoelectric material are alternately arranged, and at least one of the p-type thermoelectric material and the n-type thermoelectric material include the thermoelectric material.

44. An apparatus, comprising:
a heat source; and
a thermoelectric device including:
a thermoelectric material which absorbs heat from the heat source and comprises a chalcogenide compound represented by the following formula:

$(A_{1-a}A'_a)_{4-x}(B_{1-b}B'_b)_{3-y}$ wherein A is a Group XIII element, and A' is at least one selected from a group consisting of a Group XIII element, a Group XIV element, a rare earth element, a transition metal and combinations thereof, wherein A and A' are different from each other;
wherein B is at least one selected from a group consisting of S, Se, Te, and combinations thereof and B' is at least one selected from a group consisting of elements of Groups XIV, XV, XVI and combinations thereof, wherein B and B' are different from each other;
wherein a is larger than 0 and less than 1;
wherein b is equal to or larger than 0 and less than 1;
wherein x is between −1 and 1; and
wherein y is between −1 and 1,
a first electrode in contact with the thermoelectric material; and
a second electrode disposed substantially opposite the first electrode and in contact with the thermoelectric material.

45. The apparatus of claim 44, further comprising an insulating substrate on which at least one of the first electrode and the second electrode is disposed.

46. The apparatus of claim 44, further comprising a power source electrically connected to one of the first electrode and the second electrode.

47. The apparatus of claim 44, further comprising an electric device electrically connected one of the first electrode and the second electrode and which one of consumes and stores power.

48. A thermoelectric material comprising a chalcogenide compound represented by the following formula:

$(A_{1-a}A'_a)_{4-x}(B_{1-b}B'_b)_{3-y}$ wherein A is a Group XIII element, and A' is at least one selected from a group consisting of a Group XIII element, a Group XIV element, a rare earth element, a transition metal, and combinations thereof, wherein A and A' are different from each other;
wherein B is at least one selected from a group consisting of S, Se, Te, and combinations thereof and B' is at least one selected from a group consisting of elements of Groups XIV, XV, XVI and combinations thereof, wherein B and B' are different from each other;
wherein a is larger than 0 and less than 1;
wherein b is equal to or larger than 0 and less than 1;
wherein x is one of between −1 and 0 and between 0 and 1; and
wherein y is between −1 and 1.

* * * * *